(12) United States Patent
Iijima et al.

(10) Patent No.: US 10,935,710 B2
(45) Date of Patent: Mar. 2, 2021

(54) OPTICAL FILM, POLARIZING PLATE, IMAGE DISPLAY DEVICE, METHOD FOR PRODUCING OPTICAL FILM, AND METHOD FOR PRODUCING POLARIZING PLATE

(71) Applicant: FUJIFILM Corporation, Tokyo (JP)

(72) Inventors: Koji Iijima, Kanagawa (JP); Tatsuya Iwasaki, Kanagawa (JP); Katsufumi Ohmuro, Kanagawa (JP); Masaaki Suzuki, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 127 days.

(21) Appl. No.: 16/123,032

(22) Filed: Sep. 6, 2018

(65) Prior Publication Data
US 2019/0004225 A1    Jan. 3, 2019

Related U.S. Application Data

(63) Continuation of application No. PCT/JP2017/010136, filed on Mar. 14, 2017.

(30) Foreign Application Priority Data

Mar. 22, 2016 (JP) ............................. JP2016-057566
May 16, 2016 (JP) ............................. JP2016-097941
(Continued)

(51) Int. Cl.
*G02B 5/30* (2006.01)
*C08F 222/10* (2006.01)
(Continued)

(52) U.S. Cl.
CPC ................ *G02B 5/305* (2013.01); *B32B 7/02* (2013.01); *B32B 7/12* (2013.01); *B32B 27/08* (2013.01);
(Continued)

(58) Field of Classification Search
CPC ........ G02B 5/305; G02B 5/30; G02B 5/3016; C08F 222/1006; G02F 1/133528;
(Continued)

(56) References Cited

U.S. PATENT DOCUMENTS

2007/0042189 A1 * 2/2007 Shirai .................. G02B 5/3083
428/411.1
2009/0051858 A1 2/2009 Nakamura et al.
(Continued)

FOREIGN PATENT DOCUMENTS

| JP | 2006-215092 A | 8/2006 |
| JP | 2006-215093 A | 8/2006 |

(Continued)

OTHER PUBLICATIONS

International Search Report issued in PCT/JP2017/010136 dated May 9, 2017.
(Continued)

*Primary Examiner* — Anthony J Frost
(74) *Attorney, Agent, or Firm* — Edwards Neils LLC; Jean C. Edwards, Esq.

(57) ABSTRACT

The present invention relates to an optical film which ensures adhesiveness between a polymer film and a liquid crystal layer without deteriorating the alignment of a liquid crystal compound; a polarizing plate using the same; an image display device; a method for producing an optical film; and a method for producing a polarizing plate. The optical film includes a polymer film including a cycloolefin-based polymer, and a liquid crystal layer that is provided adjacent to the polymer film, in which the liquid crystal layer is formed by using a liquid crystal composition containing a liquid crystal compound and a compound having a specific structure, where the liquid crystal composition contains the compound having a specific structure at a content of 0.5% to
(Continued)

7.0% by mass with respect to a mass of the liquid crystal compound, and a predetermined eccentricity value is 20% to 80%.

21 Claims, 3 Drawing Sheets

(30) Foreign Application Priority Data

| Nov. 21, 2016 | (JP) | ............................ | JP2016-225802 |
| Dec. 28, 2016 | (JP) | ............................ | JP2016-256220 |
| Jan. 25, 2017 | (JP) | ............................ | JP2017-011673 |

(51) Int. Cl.

| *B32B 7/02* | (2019.01) |
| *C08L 45/00* | (2006.01) |
| *B32B 7/12* | (2006.01) |
| *B32B 27/08* | (2006.01) |
| *C08G 61/08* | (2006.01) |
| *C08L 65/00* | (2006.01) |
| *G02F 1/1335* | (2006.01) |
| *H01L 51/52* | (2006.01) |

(52) U.S. Cl.
CPC ........ *C08F 222/1006* (2013.01); *C08G 61/08* (2013.01); *C08L 45/00* (2013.01); *C08L 65/00* (2013.01); *G02B 5/30* (2013.01); *G02B 5/3016* (2013.01); *G02F 1/133528* (2013.01); *B32B 2457/202* (2013.01); *C08G 2261/418* (2013.01); *C08G 2261/724* (2013.01); *C08L 2203/20* (2013.01); *C09K 2323/00* (2020.08); *H01L 51/5281* (2013.01)

(58) Field of Classification Search
CPC ... G02F 1/1335; H01L 51/5281; H01L 51/50; C08G 2261/724; C08G 2261/418; C08G 61/08; B32B 2457/202; B32B 27/325; B32B 2307/418; B32B 2307/42; B32B 2305/55; B32B 2457/20; B32B 7/02; B32B 7/12; B32B 27/08; C08L 2203/20; C08L 45/00; C08L 65/00; H05B 33/02
See application file for complete search history.

(56) References Cited

U.S. PATENT DOCUMENTS

| 2010/0192803 | A1* | 8/2010 | Matsufiji | ................... C08L 1/14 |
| | | | | 106/170.26 |
| 2013/0027634 | A1* | 1/2013 | Saneto | ............. G02F 1/133536 |
| | | | | 349/62 |
| 2013/0057809 | A1* | 3/2013 | Nakamura | ................ B32B 9/04 |
| | | | | 349/96 |

FOREIGN PATENT DOCUMENTS

| JP | 2006-337566 A | 12/2006 |
| JP | 2007-084789 A | 4/2007 |
| JP | 2007-219193 A | 8/2007 |
| JP | 2008-009328 A | 1/2008 |
| JP | 2009-069821 A | 4/2009 |
| JP | 2010-120377 A | 6/2010 |
| JP | 2013-054201 A | 3/2013 |
| JP | 2014-191156 A | 10/2014 |

OTHER PUBLICATIONS

Written Opinion issued in PCT/JP2017/010136 dated May 9, 2017.
International Preliminary Report on Patentability completed by WIPO dated Sep. 25, 2018 in connection with International Patent Application No. PCT/JP2017/010136.
Office Action, issued by the Korean Intellectual Property Office dated Aug. 2, 2019, in connection with Korean Patent Application No. 10-2018-7026289.
Office Action, issued by the Japanese Patent Office dated Jul. 23, 2019, in connection with Japanese Patent Application No. 2018-507250.
Office Action, issued by the State Intellectual Property Office dated Apr. 2, 2020, in connection with Chinese Patent Application No. 201780018717.0.

\* cited by examiner

OPTICAL FILM, POLARIZING PLATE, IMAGE DISPLAY DEVICE, METHOD FOR PRODUCING OPTICAL FILM, AND METHOD FOR PRODUCING POLARIZING PLATE

CROSS-REFERENCE TO RELATED APPLICATIONS

This application is a Continuation of PCT International Application No. PCT/JP2017/010136 filed on Mar. 14, 2017, which was published under PCT Article 21(2) in Japanese, and which claims priority under 35 U.S.C. § 119(a) to Japanese Patent Application No. 2016-057566 filed on Mar. 22, 2016, Japanese Patent Application No. 2016-097941 filed on May 16, 2016, Japanese Patent Application No. 2016-225802 filed on Nov. 21, 2016, Japanese Patent Application No. 2016-256220 filed on Dec. 28, 2016 and Japanese Patent Application No. 2017-011673 filed on Jan. 25, 2017. The above applications are hereby expressly incorporated by reference, in their entirety, into the present application.

BACKGROUND OF THE INVENTION

1. Field of the Invention

The present invention relates to an optical film, a polarizing plate, an image display device, a method for producing an optical film, and a method for producing a polarizing plate.

2. Description of the Related Art

Conventionally, a film having a phase difference layer in which a liquid crystal compound is aligned and fixed has been widely investigated.

Such a phase difference layer is commonly formed by forming an alignment layer on a transparent substrate (support) and applying a liquid crystal compound on the surface of the alignment layer.

For example, JP2008-009328A discloses a phase difference film including a transparent substrate formed of a cycloolefin-based resin, an adhesive alignment layer which is formed so as to come into contact with the transparent substrate, contains a polymer of a polymerizable monomer having a predetermined polymerizable group and has an alignment controlling force to perform homeotropic alignment of a liquid crystal material, and a phase difference layer which is formed on the adhesive alignment layer, contains a liquid crystal material, and satisfies a relationship of nx=ny<nz between refractive indices nx and ny in random x and y directions orthogonal to each other in an in-plane direction and a refractive index nz in a thickness direction.

SUMMARY OF THE INVENTION

On the other hand, upon the recent demand for reducing the thickness of a display device, it is further required to reduce the thickness of an optical film.

Here, for example, it is considered to remove an alignment layer in which a liquid crystal compound is aligned. However, there is concern that adhesiveness to the liquid crystal layer and the alignment of the liquid crystal compound is deteriorated by removing the alignment layer.

In addition, from the viewpoint of reducing the thickness of a polymer film constituting a transparent substrate, using a cycloolefin-based polymer exhibiting higher optical anisotropy is considered. However, there is concern that the cycloolefin-based polymer is not easily closely attached to a liquid crystal layer compared to a cellulose-based polymer which has been conventionally used.

Here, an object of the present invention is to provide an optical film capable of ensuring adhesiveness between a polymer film and a liquid crystal layer without deteriorating the alignment of a liquid crystal compound even in a case where the liquid crystal layer is provided adjacent to the polymer film formed by using a cycloolefin-based polymer, a polarizing plate using the same, an image display device, a method for producing an optical film, and a method for producing a polarizing plate.

As a result of conducting intensive investigations to achieve the above object, the present inventors have found that, even in a case where a liquid crystal layer in which a specific compound is unevenly distributed is arranged adjacent to a polymer film formed by using a cycloolefin-based polymer, adhesiveness between the polymer film and the liquid crystal layer is ensured without deteriorating the alignment of a liquid crystal compound.

That is, it has been found that the above object can be achieved by adopting the following configurations.

[1] An optical film comprising:

a polymer film including a cycloolefin-based polymer, and a liquid crystal layer that is provided adjacent to the polymer film, in which the liquid crystal layer is formed by using a liquid crystal composition containing a liquid crystal compound and a compound represented by Formula (I), the liquid crystal composition contains the compound represented by Formula (I) at a content of 0.5% to 7.0% by mass with respect to a mass of the liquid crystal compound, and an eccentricity value represented by Expression (1-1) is 20% to 80%, $$(Z)_n\text{-}L^{100}\text{-}(Q)_m \qquad \text{Formula (I)}$$

in Formula (I),

Z represents a substituent having a polymerizable group, n represents an integer of 0 to 4, and in a case where n is an integer of 2 to 4, two or more Z's may be the same as or different from each other, Q represents a substituent containing at least one boron atom, m represents 1 or 2, and in a case where m is 2, two Q's may be the same as or different from each other, and $L^{100}$ represents an (n+m)-valent linking group; where in a case where n represents 0 and m represents 1, $L^{100}$ represents a hydrogen atom, a substituted or unsubstituted alkyl group, a substituted or unsubstituted alkenyl group, a substituted or unsubstituted alkynyl group, a substituted or unsubstituted aryl group, or a substituted or unsubstituted heteroaryl group, $$S_{0.1}/S_{total} \times 100\% \qquad \text{Expression (1-1)}$$

in Expression (1-1), $S_{total}$ represents an integrated value of $BO_2^-$ secondary ion intensity detected by time-of-flight secondary ion mass spectrometry; and $S_{0.1}$ represents an integrated value of $BO_2^-$ secondary ion intensity detected by time-of-flight secondary ion mass spectrometry in a region from the interface of the liquid crystal layer with the polymer film to a distance of 1/10 of the film thickness of the liquid crystal layer.

[2] An optical film comprising:
a polymer film including a cycloolefin-based polymer; and
a liquid crystal layer that is provided adjacent to the polymer film,
in which the liquid crystal layer is formed by using a liquid crystal composition containing a liquid crystal compound and a compound represented by Formula (I),
the liquid crystal composition contains the compound represented by Formula (I) at a content of 0.5% to 7.0% by mass with respect to a mass of the liquid crystal compound, and
a peak intensity ratio represented by Expression (1-2) is 1.1 to 5.0, $$(Z)_n\text{-}L^{100}\text{-}(Q)_m \quad \text{Formula (I)}$$

in Formula (I),
Z represents a substituent having a polymerizable group, n represents an integer of 0 to 4, and in a case where n is an integer of 2 to 4, two or more Z's may be the same as or different from each other;
Q represents a substituent containing at least one boron atom, m represents 1 or 2, and in a case where m is 2, two Q's may be the same as or different from each other; and
$L^{100}$ represents an (n+m)-valent linking group; where in a case where n represents 0 and m represents 1, $L^{100}$ represents a hydrogen atom, a substituted or unsubstituted alkyl group, a substituted or unsubstituted alkenyl group, a substituted or unsubstituted alkynyl group, a substituted or unsubstituted aryl group, or a substituted or unsubstituted heteroaryl group, $$P_1/P_{ave} \quad \text{Expression (1-2)}$$

in Expression (1-2),
$P_1$ represents a peak intensity present on the side closest to the polymer film among peaks of $BO_2^-$ secondary ion intensity detected by time-of-flight secondary ion mass spectrometry; and
$P_{ave}$ represents an average value of $BO_2^-$ secondary ion intensity detected by time-of-flight secondary ion mass spectrometry on a side more apart from the polymer film than from a peak position where the peak intensity of $P_1$ is calculated; where a secondary ion intensity of a peak closest to a surface of the liquid crystal layer opposite to the surface on which the polymer film is provided is excluded from calculation of $P_{ave}$.

[3] The optical film according to [1] or [2],
in which the liquid crystal compound is vertically aligned.

[4] The optical film according to any one of [1] to [3],
in which the liquid crystal compound is a rod-like liquid crystal compound.

[5] The optical film according to any one of [1] to [4],
in which an in-plane retardation Re1(550) and a thickness direction retardation Rth1(550) of the polymer film at a wavelength of 550 nm respectively satisfy Expression (2) and Expression (3), and
an in-plane retardation Re2(550) and a thickness direction retardation Rth2(550) of the liquid crystal layer at a wavelength of 550 nm respectively satisfy Expression (4) and Expression (5), or Expression (6) and Expression (7).

| 5 nm≤Re1(550)≤300 nm | Expression (2) |
| 10 nm≤Rth1(550)≤240 nm | Expression (3) |
| 0 nm≤Re2(550)≤10 nm | Expression (4) |
| −360 nm≤Rth2(550)≤−50 nm | Expression (5) |
| 10 nm≤Re2(550)≤220 nm | Expression (6) |
| −110 nm≤Rth2(550)≤−5 nm | Expression (7) |

[6] A polarizing plate comprising:
the optical film according to any one of [1] to [5]; and
a polarizer.

[7] The polarizing plate according to [6], further comprising:
a protective film.

[8] The polarizing plate according to [7],
in which the protective film and the optical film are laminated through a pressure sensitive adhesive or an adhesive.

[9] The polarizing plate according to [8],
in which an in-plane retardation Re3(550) and a thickness direction retardation Rth3(550) of the protective film at a wavelength of 550 nm respectively satisfy Expression (8) and Expression (9).

| 0 nm≤Re3(550)≤10 nm | Expression (8) |
| −40 nm≤Rth3(550)≤40 nm | Expression (9) |

[10] The polarizing plate according to [9],
in which the protective film is a wavelength dispersion compensation layer further satisfying Expression (10) and Expression (11).

| 3 nm≤|Rth3(450)−Rth3(550)|≤30 nm | Expression (10) |
| 0 nm≤|Rth3(450)|≤30 nm or 0 nm≤|Rth3(550)|≤30 nm | Expression (11) |

[11] The polarizing plate according to any one of [7] to [10],
in which the protective film is a cellulose acylate film.

[12] An image display device comprising:
the polarizing plate according to any one of [6] to [11]; and
an image display element.

[13] An image display device comprising:
the polarizing plate according to any one of [6] to [11];
an image display element; and
a facing polarizing plate,
in which the image display element is a liquid crystal cell, and
the facing polarizing plate is a facing polarizing plate having a polarizer and a protective film satisfying Expression (10) and Expression (11) and is arranged such that the protective film is disposed on a liquid crystal cell side.

| 3 nm≤|Rth3(450)−Rth3(550)|≤30 nm | Expression (10) |
| 0 nm≤|Rth3(450)|<30 nm or 0 nm≤|Rth3(550)|<30 nm | Expression (11) |

[14] A method for producing an optical film comprising:
a surface treatment step of subjecting a surface of a polymer film including a cycloolefin-based polymer to a surface treatment so as to have a water contact angle of 5° to 65°; and
a liquid crystal layer forming step of bringing a liquid crystal composition including a liquid crystal compound, a compound represented by Formula (I), and a solvent into contact with the surface-treated surface and then forming a liquid crystal layer,
in which the liquid crystal composition is a composition containing the compound represented by Formula (I) at a content of 0.5% to 7.0% by mass with respect to a mass of the liquid crystal compound, $$(Z)_n\text{-}L^{100}\text{-}(Q)_m \quad \text{Formula (I)}$$

in Formula (I),

Z represents a substituent having a polymerizable group, n represents an integer of 0 to 4, and in a case where n is an integer of 2 to 4, two or more Z's may be the same as or different from each other;

Q represents a substituent containing at least one boron atom, m represents 1 or 2, and in a case where m is 2, two Q's may be the same as or different from each other, and $L^{100}$ represents an (n+m)-valent linking group; where in a case where n represents 0 and m represents 1, $L^{100}$ represents a hydrogen atom, a substituted or unsubstituted alkyl group, a substituted or unsubstituted alkenyl group, a substituted or unsubstituted alkynyl group, a substituted or unsubstituted aryl group, or a substituted or unsubstituted heteroaryl group.

[15] The method for producing an optical film according to [14], in which the surface treatment is an addition treatment of adding a hydroxyl group or a carboxyl group to the surface of the polymer film.

[16] The method for producing an optical film according to [15], in which the addition treatment is a corona treatment.

[17] The method for producing an optical film according to any one of [14] to [16], in which the solvent is a solvent which does not dissolve the cycloolefin-based polymer in the polymer film.

[18] The method for producing an optical film according to any one of [14] to [17], in which in the liquid crystal layer forming step, the liquid crystal compound is fixed by irradiation with ultraviolet rays in an air atmosphere.

[19] A method for producing a polarizing plate for preparing a polarizing plate using an optical film prepared by the method for producing an optical film according to [18], the method comprising:

a lamination step of laminating a liquid crystal layer of the optical film and a polarizer with an ultraviolet curable adhesive.

According to the present invention, it is possible to provide an optical film capable of ensuring adhesiveness between a polymer film and a liquid crystal layer without deteriorating the alignment of a liquid crystal compound even in a case where the liquid crystal layer is provided adjacent to the polymer film formed by using a cycloolefin-based polymer, a polarizing plate using the same, an image display device, a method for producing an optical film, and a method for producing a polarizing plate.

DESCRIPTION OF THE PREFERRED EMBODIMENTS

Figure 1:
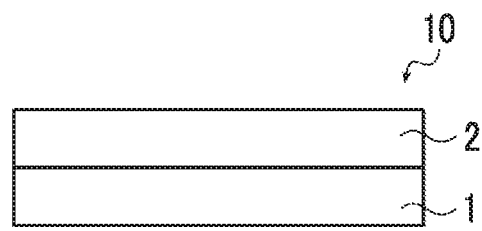
FIG. 1 is a cross-sectional view schematically showing an example of an embodiment of an optical film according to the present invention.

Hereinafter, the present invention will be described in detail.

The description of the constitutional requirements described below is made on the basis of representative embodiments of the present invention, but it should not be construed that the present invention is limited to those embodiments.

In the present specification, numerical value ranges expressed by the term "to" mean that the numerical values described before and after "to" are included as a lower limit and an upper limit, respectively.

In the present specification, the term "polarizing plate" refers to a plate in which a protective layer or a functional layer is arranged on at least one surface of a polarizer and is used as distinguished from the term "polarizer" and "polarizing plate".

In the present specification, the terms "parallel" and "orthogonal" encompass not only being parallel and orthogonal in the strict sense but also a range of ±5° from being parallel or orthogonal, respectively.

In the present specification, the term "(meth)acrylate" means either acrylate or methacrylate, the term "(meth)acryl" means either acryl or methacryl", and the term "(meth)acryloyl" means either acryloyl or methacryloyl.

In the present specification, the concept of the terms "liquid crystal composition" and "liquid crystal compound" includes a liquid crystal composition and a liquid crystal compound of which liquid crystallinity is already lost by curing or the like.

<<Retardation>>

In the present invention, Re(λ) and Rth(λ) represent an in-plane retardation and a thickness direction retardation at a wavelength of λ, respectively. Unless otherwise specified, the wavelength of λ is set to 550 nm.

In the present invention, Re(λ) and Rth(λ) are values measured at a wavelength of λ in an AxoScan OPMF-1 (manufactured by Opto Science, Inc.). In a case where the average refractive index ((Nx+Ny+Nz)/3) and the film thickness (d (μm)) are input to AxoScan, it is possible to calculate Slow axis direction (°)

$Re(\lambda)=R0(\lambda)$ $Rth(\lambda)=((Nx+Ny)/2-Nz)\times d.$

<<Refractive Index>>

In the present invention, refractive indices Nx, Ny, and Nz are measured by using an Abbe refractometer (NAR-4T, manufactured by Atago Co., Ltd.) and a sodium lamp (λ=589 nm) as a light source.

In addition, wavelength dependency can be measured with a multi-wavelength Abbe refractometer DR-M2 (manufactured by Atago Co., Ltd.) in combination with an interference filter.

In addition, values mentioned in Polymer Handbook (JOHN WILEY & SONS, INC.) or in the catalogues of various optical films can be used.

The values of the average refractive indices of major optical films are shown below as examples: cellulose acylate (1.48), cycloolefin polymer (1.52), polycarbonate (1.59), polymethyl methacrylate (1.49), and polystyrene (1.59).

<Optical Film>

An optical film of the present invention has a polymer film including a cycloolefin-based polymer and a liquid crystal layer that is provided adjacent to the polymer film.

In addition, in the optical film of the present invention, the liquid crystal layer is formed by using a liquid crystal composition containing a liquid crystal compound and a compound represented by Formula (I) described later.

Further, in the optical film of the present invention, the liquid crystal composition is a composition containing the compound represented by Formula (I) described later at a content of 0.5% to 7.0% by mass with respect to the mass of the liquid crystal compound.

Then, in an optical film according to a first aspect out of optical films according to aspects of the present invention, an eccentricity value represented by Expression (1-1) described later satisfies 20% to 80%.

On the other hand, in an optical film according to a second aspect out of the optical films of the present invention, a peak intensity ratio represented by Expression (1-2) described later satisfies 1.1 to 5.0.

In the following description, in a case where the first and second aspects do not need to be particularly distinguished from each other, these aspects are collectively simply abbreviated as "optical film of the present invention".

In the first aspect of the optical film of the present invention, the eccentricity value represented by Expression (1-1) described later satisfies 20% to 80% and in the second aspect of the optical film of the present invention, the peak intensity ratio represented by Expression (1-2) described later satisfies 1.1 to 5.0. Thus, even in a case where the liquid crystal layer provided adjacent to the polymer film formed by using a cycloolefin-based polymer, it is possible to ensure adhesiveness between the polymer film and the liquid crystal layer without deteriorating the alignment of the liquid crystal compound.

Regarding this mechanism, although the details thereof are not clear, the present inventors are assumed as follows.

Since the surface of the cycloolefin-based polymer film does not commonly have a structure interacting with the compound represented by Formula (I) described later even in a case where the compound represented by Formula (I) described later is added to the composition forming the liquid crystal layer, the compound does not contribute to improving adhesiveness with the liquid crystal layer to be formed.

For example, it is considered that by setting the surface of the polymer film to have a water contact angle of a specific value, that is, to have a hydrophilic structure, and then forming a liquid crystal layer by using the composition having the compound represented by Formula (I) described later, the eccentricity value represented by Expression (1-1) described later or the peak intensity ratio represented by Expression (1-2) described later is within a predetermined range, and the polymer film and the liquid crystal layer interact with each other so that adhesiveness can be ensured in a state in which alignment is not lost.

Generally, at the interface between a polymer film and a coating layer, the coating layer and the polymer film are mixed with each other to form an infiltration layer in some cases.

In addition, generally, it is understood that forming such an infiltration layer is advantageous for adhesiveness.

However, in the configuration of the optical film of the present invention, it is preferable that the infiltration layer is small. Although the reason therefor is not clear, it is considered that in a case where the liquid crystal compound in the coating layer and the polymer film are mixed with each other, the alignment of the liquid crystal compound is inhibited by the polymer chain of the polymer film.

In addition, it is considered that in a case where the infiltration layer is small, the compound represented by Formula (I) above and the polymer film interact with each other effectively so that alignment can be improved.

Further, it is considered that in a case where the infiltration layer is provided, the compound represented by Formula (I) above is locally unevenly distributed so that alignment can be improved.

Here, the term "infiltration layer" in the present invention means a region in which both the material of the polymer film and the material of the liquid crystal layer are detected.

The thickness of the infiltration layer is preferably within a range of 30 to 300 nm and more preferably within a range of 50 to 250 nm. Within this range, the adhesiveness between the liquid crystal layer and the polymer film is good and the alignment of the liquid crystal layer can be improved. The detection method will be described later.

FIG. 1 is a cross-sectional view schematically showing an example of an optical film of the present invention.

An optical film 10 shown in FIG. 1 has a polymer film 1 including a cycloolefin-based polymer and a liquid crystal layer 2 that is provided adjacent to the polymer film 1.

Next, the polymer film and the liquid crystal layer constituting the optical film of the present invention will be described in detail.

[Polymer Film]

The polymer film of the optical film of the present invention is a polymer film including a cycloolefin-based polymer.

Regarding the content of the cycloolefin-based polymer, the content of the cycloolefin-based polymer is preferably 60% by mass or more and more preferably 80% by mass or more with respect to the total solid content of the polymer film.

{Cycloolefin-Based Polymer}

Examples of the cycloolefin-based polymer used in the present invention include (1) a norbornene-based polymer; (2) a monocyclic cycloolefin polymer, (3) a cyclic conjugated diene polymer, (4) a vinyl alicyclic hydrocarbon polymer, and hydrides of (1) to (4).

Specific suitable examples of the cycloolefin-based polymer include an addition (co)polymer cyclopolyolefin including at least one repeating unit represented by Formula (III) below, and an addition (co)polymer cyclopolyolefin including at least one repeating unit represented by Formula (II) below together with the repeating unit represented by Formula (III) below.

As the cycloolefin-based polymer, a ring-opening (co) polymer including at least one cyclic repeating unit represented by Formula (IV) below can also be suitably used.

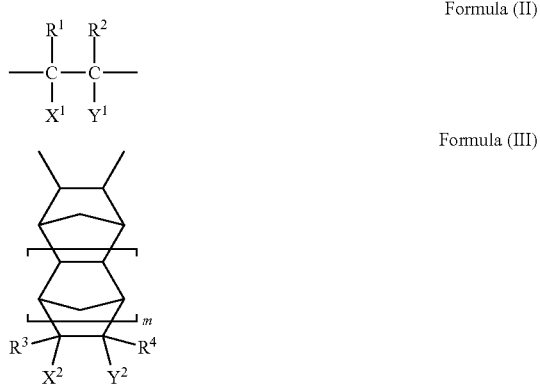

Formula (II)

Formula (III)

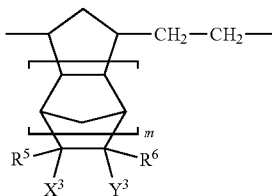

Formula (IV)

In Formulae (II) to (IV) above, m represents an integer of 0 to 4. $R^1$ to $R^6$ each represent a hydrogen atom or a hydrocarbon group having 1 to 10 carbon atoms, $X^1$ to $X^3$ and $Y^1$ to $Y^3$ each represent a hydrogen atom, a hydrocarbon group having 1 to 10 carbon atoms, a halogen atom, a hydrocarbon group having 1 to 10 carbon atoms substituted with a halogen atom, —$(CH_2)_nCOOR^{11}$, —$(CH_2)_nOCOR^{12}$, —$(CH_2)_nNCO$, —$(CH_2)_nNO_2$, —$(CH_2)_nCN$, —$(CH_2)_n CONR^{13}R^{14}$, —$(CH_2)_nNR^{13}R^{14}$, —$(CH_2)_nOZ$, —$(CH_2)_nW$, or (—$CO)_2O$ or (—$CO)_2NR^{15}$, each of which is constituted with $X^1$ and $Y^1$, $X^2$ and $Y^2$, or $X^3$ and $Y^3$. $R^{11}$, $R^{12}$, $R^{13}$, $R^{14}$, and $R^{15}$ each represent a hydrogen atom or a hydrocarbon group having 1 to 20 carbon atoms, Z represents a hydrocarbon group or a hydrocarbon group substituted with halogen atom, W represents $SiR^{16}_pD_{3-p}$ ($R^{16}$ represents a hydrocarbon group having 1 to 10 carbon atoms, D represents a halogen atom, —$OCOR^{16}$ or —$OR^{16}$, and p represents an integer of 0 to 3), and n represents an integer of 0 to 10.

In Formulae (II) to (IV) above, introduction of a functional group having large polarity to any of the substituents of $X^1$ to $X^3$ and $Y^1$ to $Y^3$ makes it possible to increase Rth of the optical film and enhance development of Re. A film with enhanced Re development can have an increased Re value by stretching during a film formation procedure.

As the cycloolefin-based polymer used in the present invention, those disclosed in JP1998-7732A (JP-H10-7732A), JP2002-504184A, US2004229157A1, and WO2004/070463A1 can be used. The norbornene-based polymer is obtained by addition polymerization of norbornene-based polycyclic unsaturated compounds to each other. In addition, if necessary, a norbornene-based polycyclic unsaturated compound can be addition-polymerized with ethylene, propylene, butene; a conjugated diene such as butadiene or isoprene; a non-conjugated diene such as ethylidene norbornene; or a linear diene compound such as acrylonitrile, acrylic acid, methacrylic acid, maleic acid anhydride, an acrylic ester, a methacrylic ester, maleimide, vinyl acetate, or vinyl chloride.

As the norbornene-based addition (co)polymer, commercially available products can be used. Specifically, the norbornene-based addition (co)polymer is sold under the trade name APEL manufactured by Mitsui Chemicals, Inc., and for example, there are grades such as APL8008T (Tg 70° C.), APL6013T (Tg 125° C.), and APL6015T (Tg 145° C.) which have different glass transition temperatures (Tg). Pellets such as TOPAS 8007, 6013, and 6015 are sold by Polyplastic Co., Ltd. In addition, Appear 3000 is sold by Ferrania Technologies.

As the hydride of the norbornene-based polymer, those obtained by addition polymerization or metathesis ring opening polymerization of a polycyclic unsaturated compound, followed by hydrogenation as disclosed, for example, in JP1989-240517A (JP-H01-240517A), JP1995-196736A (JP-H07-196736A), JP1985-26024A (JP-S60-26024A), JP1987-19801A (JP-S62-19801A), JP2003-1159767A, and JP2004-309979A can be used.

In the norbornene-based polymer used in the present invention, $R^5$ and $R^6$ in Formula (IV) above represent preferably a hydrogen atom or —$CH_3$, $X^3$ and $Y^3$ in Formula (IV) above represent preferably a hydrogen atom, Cl, or —$COOCH_3$, and other groups are appropriately selected.

As the norbornene-based resin, commercially available products can be used. Specifically, the norbornene-based resin is sold under the trade names of Arton G and Arton F from JSR Corporation, and under the trade names of Zeonor ZF14, Zeonor ZF16, Zeonex 250, and Zeonex 280 from Zeon Corporation, and these can be used.

The mass average molecular weight (Mw) of the cycloolefin-based polymer used in the present invention, as measured by gel permeation chromatography (GPC) and calculated in terms of polystyrene, is preferably 5,000 to 1,000,000, more preferably 10,000 to 500,000, and even more preferably 50,000 to 300,000.

In addition, the molecular weight distribution (Mw/Mn; Mn is a number average molecular weight as measured by GPC) is preferably 10 or less, more preferably 5.0 or less, and even more preferably 3.0 or less.

The glass transition temperature (Tg) measured by differential scanning calorimetry (DSC) is preferably in a range of 50° C. to 350° C., more preferably in a range of 80° C. to 330° C., and even more preferably in a range of 100° C. to 300° C.

The cycloolefin-based polymer used in the present invention may contain additives within a range not departing from the spirit of the present invention, the description of paragraphs 0025 to 0074 and 0086 to 0091 of JP2009-114303A can be referred to, and the contents of which are incorporated in the present specification.

{Water Contact Angle of Polymer Film}

It is preferable that the surface of the polymer film of the optical film of the present invention adjacent to the liquid crystal layer is subjected to a surface treatment so as to have a water contact angle of 5° to 65° as shown in the method for producing an optical film of the present invention described later.

The water contact angle of the polymer film is more preferably 5° to 55° and particularly preferably 5° to 500.

In the present invention, it is considered that the water contact angle is an index for indicating the presence of a structure interacting with the compound represented by Formula (I) above on the surface of the polymer film.

Here, as the structure interacting with the compound represented by Formula (I) above, a hydroxyl group or a carboxyl group is preferable and a hydroxyl group is more preferable.

<<Method for Measuring Water Contact Angle>>

In the present invention, the water contact angle is a value measured by the following method.

The water contact angle is measured based on a sessile drop method of JIS R 3257:1999.

For measuring the water contact angle, LSE-ME1 (software 2win mini) manufactured by NiCK Corporation is used. Specifically, at room temperature 20° C., 2 μl of liquid droplets of pure water are added dropwise onto the surface of the polymer film which is kept horizontal, and a contact angle at a point in time when 20 seconds has elapsed from the dropwise addition is measured.

{Optical Properties of Polymer Film}

Since display performance is improved in a case where a polarizing plate of the present invention described later is used in an image display device, the optical properties of the polymer film of the optical film of the present invention preferably satisfy Expression (2) and Expression (3) below, more preferably satisfy Expression (2-1) and Expression (3-1) below, and even more preferably satisfy Expression (2-2) and Expression (3-2) below.

$$5 \text{ nm} \leq Re1(550) \leq 300 \text{ nm} \quad \text{Expression (2)}$$

$$10 \text{ nm} \leq Rth1(550) \leq 240 \text{ nm} \quad \text{Expression (3)}$$

$$40 \text{ nm} \leq Re1(550) \leq 200 \text{ nm} \quad \text{Expression (2-1)}$$

$$20 \text{ nm} \leq Rth1(550) \leq 200 \text{ nm} \quad \text{Expression (3-1)}$$

$$80 \text{ nm} \leq Re1(550) \leq 150 \text{ nm} \quad \text{Expression (2-2)}$$

$$40 \text{ nm} \leq Rth1(550) \leq 150 \text{ nm} \quad \text{Expression (3-2)}$$

{Stretching of Polymer Film}

Various properties can be adjusted by stretching the polymer film of the optical film of the present invention. Specifically, an in-plane retardation (Re), a thickness direction retardation (Rth), and a random film thickness can be exhibited by (monoaxially or biaxially stretching) stretching the polymer film in a machine direction (conveyance direction) and a cross direction (width direction).

In order to adjust properties, stretching and relaxation may be combined. For example, each treatment of the following (a) to (k) can be performed.

(a) cross-direction stretching
(b) machine-direction stretching
(c) cross-direction stretching→relaxation treatment
(d) machine-direction stretching→relaxation treatment
(e) machine-direction stretching→cross-direction stretching
(f) machine-direction stretching→cross-direction stretching→relaxation treatment
(g) machine-direction stretching→relaxation treatment→cross-direction stretching →relaxation treatment
(h) cross-direction stretching→machine-direction stretching→relaxation treatment
(i) cross-direction stretching→relaxation treatment→machine-direction stretching →relaxation treatment
(j) machine-direction stretching→cross-direction stretching→machine-direction stretching
(k) machine-direction stretching→cross-direction stretching→machine-direction stretching→relaxation treatment Among these, a cross-direction stretching step of (a) and a machine-direction stretching step of (b) are particularly important.

<Machine-Direction Stretching>

In a case where the polymer film is stretched in the machine direction, for example, the polymer film is preheated with a plurality of preheating rollers and then a stretching step can be performed in the machine direction by giving a difference in circumferential speed between a pair of stretching rollers.

In the machine-direction stretching step, as described in paragraphs [0036] to [0045] of JP2008-213332A, in order to prevent creases, the circumferential speed of a plurality of preheating rollers and stretching rollers on the upstream side may be gradually increased toward the downstream based on a change in temperature before and after contact of the film with each roller, and an appropriate tension is imparted between the respective preheating rollers.

In addition, as described in paragraphs [0022] to [0031] of JP2011-207168A, in order to suppress the generation of scratches, a film may be rapidly cooled by a cooling roller after machine-direction stretching.

<Cross-Direction Stretching>

In a case where the polymer film is subjected to cross-direction stretching, for example, the polymer film can be stretched in the cross direction using a tenter. That is, both end portions of the polymer film in the width direction are held with clips and the film is stretched in the cross direction while widening the width. At this time, the stretching temperature can be controlled by sending air having a desired temperature in the tenter.

In the present specification, the "stretching temperature" (hereinafter, also referred to as "cross-direction stretching temperature") is specified by the film surface temperature of the polymer film.

It is preferable to control the stretching temperature to be in a range of Tg−40° C. to Tg+40° C. That is, the cross-direction stretching temperature in the cross-direction stretching step is preferably Tg−40° C. to Tg+40° C., more preferably Tg−20° C. to Tg+20° C., and even more preferably Tg−10° C. to Tg+10° C. Here, the cross-direction stretching temperature in the cross-direction stretching step means the average temperature between the stretching start point and the stretching end point.

The stretching time in the cross-direction stretching step is preferably 1 second to 10 minutes, more preferably 2 seconds to 5 minutes, and even more preferably 5 seconds to 3 minutes. By controlling the stretching temperature and the stretching time to be within the above ranges, Re, Rth, and the film thickness can be adjusted to be within the preferable ranges of the present invention.

In addition, the cross-direction stretching ratio is preferably 1.01 to 4 times, more preferably 1.03 to 3.5 times, and even more preferably 1.1 to 3.0 times. The cross-direction stretching ratio is particularly preferably 1.51 to 3.0 times.

<Simultaneous Biaxial Stretching>

In a case where the polymer film is simultaneously biaxially stretched, as well as the common cross-direction stretching method, simultaneous biaxial stretching can be simultaneously performed in a cross direction and in a machine direction by widening the polymer film using clips in the cross direction and simultaneously stretching or relaxing the polymer film in the machine direction. Specifically, the methods described in JP1980-93520U (JP-S55-93520U), JP1988-247021A (JP-S63-247021A), JP1994-210726A (JP-H06-210726A), JP1994-278204A (JP-H06-278204A), JP2000-334832A, JP2004-106434A, JP2004-195712A, JP2006-142595A, JP2007-210306A, JP2005-22087A, JP2006-517608A, and JP2007-210306A may be referred to.

Before being stretched, the polymer film may be preheated, and after being stretched, the polymer film may be thermally fixed, whereby the Re and Rth distribution after stretching may be reduced and the alignment angle variation with bowing can be reduced. Any one of these preheating and thermal fixation may be performed, but preferably, both these preheating and thermal fixation are performed. These preheating and thermal fixation are preferably performed by holding the film with clips, or that is, it is preferable that the preheating, the stretching and the thermal fixation are performed continuously.

The preheating can be performed at a temperature higher by about 1° C. to 50° C. than the stretching temperature, preferably at a temperature higher by 2° C. to 40° C. than the stretching temperature, and more preferably at a temperature higher by 3° C. or more and 30° C. or less than the stretching temperature. The preheating time is preferably 1 second or longer and 10 minutes or shorter, more preferably 5 seconds or longer and 4 minutes or shorter, and even more preferably 10 seconds or longer and 2 minutes or shorter. During the preheating, the tenter width is preferably kept nearly constant. The term "nearly" is meant to indicate ±10% of the width of the non-stretched film.

The thermal fixation may be performed at a temperature lower by 1° C. or more and 50° C. or less than the stretching temperature, more preferably at a temperature lower by 2° C. or more and 40° C. or less than the stretching temperature, and even more preferably at a temperature lower by 3° C. to 30° C. than the stretching temperature. Still more preferably, the thermal fixation temperature is equal to or lower than the stretching temperature and equal to or lower than Tg. The thermal fixation time is preferably from 1 second or longer and 10 minutes or shorter, more preferably 5 seconds or longer and 4 minutes or shorter, even more preferably 10 seconds or longer and 2 minutes or shorter. During the thermal fixation, the tenter width is preferably kept nearly constant. The term "nearly" refers to a range of from 0% of the tenter width after the end of stretching (the same width as the tenter width after the stretching) to −10% thereof (smaller by 10% than the tenter width after the stretching=width reduction). In a case where the width of the film is widened by the stretched width or more, residual strain is easily generated in the polymer film and changes in Re and Rth with time are easily increased. Thus, this case is not preferable.

According to such stretching, the variation in Re or Rth in the width direction and longitudinal direction can be 5% or less, more preferably 4% or less, and even more preferably 3% or less. Further, the alignment angle can be 90°±5° or less or 0°±5° or less, more preferably 90°±3° or less or 0°±3° or less, and even more preferably 90°±1° or less or 0°±1° or less.

A high speed stretching treatment may be performed. The stretching treatment can be performed at a stretching speed of, preferably equal to or higher than 20 m/minute, more preferably equal to or higher than 25 m/minute, and even more preferably equal to or higher than 30 m/minute.

In the present invention, the thickness of the polymer film is not particularly limited but is preferably 5 μm to 60 μm, more preferably 7 μm to 50 μm, and even more preferably 10 μm to 40 μm.

[Liquid Crystal Layer]

The liquid crystal layer of the optical film of the present invention is a layer provided adjacent to the above-described polymer film, and is a liquid crystal layer formed by using a liquid crystal composition containing a liquid crystal compound and a compound represented by Formula (I) described later.

In addition, the liquid crystal composition contains the compound represented by Formula (I) described later at a content of 0.5% to 7.0% by mass with respect to the mass of the liquid crystal compound.

{Optical Properties of Liquid Crystal Layer}

The optical properties of the liquid crystal layer of the optical film of the present invention preferably satisfy Expression (4) and Expression (5), or Expression (6) and Expression (7) below since display performance is improved in a case of using a polarizing plate of the present invention described later in an image display device.

0 nm≤Re2(550)≤10 nm  Expression (4)

−360 nm≤Rth2(550)≤−50 nm  Expression (5)

10 nm≤Re2(550)≤220 nm  Expression (6)

−110 nm≤Rth2(550)≤−5 nm  Expression (7)

In addition, the optical properties of the liquid crystal layer of the optical film of the present invention more preferably satisfy Expression (4-1) and Expression (5-1) below, or Expression (6-1) and Expression (7-1) below, and even more preferably satisfy Expression (4-2) and Expression (5-2) below, or Expression (6-2) and Expression (7-2) below.

0 nm≤Re2(550)≤5 nm  Expression (4-1)

−270 nm≤Rth2(550)≤−50 nm  Expression (5-1)

20 nm≤Re2(550)≤200 nm  Expression (6-1)

−100 nm≤Rth2(550)≤−10 nm  Expression (7-1)

0 nm≤Re2(550)≤1 nm  Expression (4-2)

−180 nm≤Rth2(550)≤−100 nm  Expression (5-2)

60 nm≤Re2(550)≤160 nm  Expression (6-2)

−80 nm≤Rth2(550)≤−30 nm  Expression (7-2)

In the present invention, the thickness of the liquid crystal layer is not particularly limited but is preferably 0.1 μm to 10 μm, more preferably 0.3 μm to 8 μm, and even more preferably 0.5 μm to 5 μm.

{Liquid Crystal Compound}

The liquid crystal composition for forming the liquid crystal layer of the optical film of the present invention contains a liquid crystal compound.

The liquid crystal compound is preferably a rod-like liquid crystal compound or a discotic liquid crystal compound and is more preferably a rod-like liquid crystal compound since display performance is improved in a case of using a polarizing plate of the present invention described later in an image display device.

As the rod-like liquid crystal compound which can be used, for example, the description in paragraphs [0045] to [0066] of JP2009-217256A can be referred to, and the contents thereof are incorporated in the present specification.

As the discotic liquid crystal compound, for example, the descriptions in paragraphs [0025] to [0153] of JP2006-301614A, paragraphs [0020] to [0122] of JP2007-108732A, and paragraphs [0012] to [0108] of JP2010-244038A can be referred to, and the contents thereof are incorporated in the present specification.

It is preferable that the liquid crystal compound used in the present invention is fixed in a vertically aligned state to adjust the optical properties of the liquid crystal layer.

For example, a layer formed by fixing the rod-like liquid crystal compound in a vertically aligned state can function as a positive C-plate. In addition, a layer formed by fixing the discotic liquid crystal compound in a vertically aligned state can function as a negative A-plate.

In the present invention, the vertical alignment is an alignment state in which in a case of the rod-like liquid crystal compound, the normal direction of the layer and the long axis direction of the liquid crystal molecule are parallel with each other, and in a case of the discotic liquid crystal compound, the normal direction of the layer and the disc plane of the liquid crystal molecule are parallel with each other. It is particularly preferable that the long axis direction of the liquid crystal molecule and the disc plane of the liquid crystal molecule are parallel with the normal direction of the layer. However, the long axis direction of the liquid crystal molecule and the disc plane of the liquid crystal molecule may be tilted according to the alignment state of the liquid crystal molecules in some cases. The tilt angle is preferably within 3.5°.

Here, in a case where the rod-like liquid crystal compound is vertically aligned, it is preferable that Expressions (4) and (5) above are satisfied. In a case where the discotic liquid crystal compound is vertically aligned, it is preferable that Expressions (6) and (7) above are satisfied.

{Compound Represented by Formula (I)}

The liquid crystal composition for forming the liquid crystal layer of the optical film of the present invention contains a compound represented by Formula (I) below.

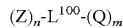                                    Formula (I)

Here, in Formula (I), Z represents a substituent having a polymerizable group, n represents an integer of 0 to 4, and in a case where n is an integer of 2 to 4, two or more Z's may be the same as or different from each other.

Q represents a substituent containing at least one boron atom, m represents 1 or 2, and in a case where m is 2, two Q's may be the same as or different from each other.

$L^{100}$ represents an (n+m)-valent linking group. However, in a case where n represents 0 and m represents 1, $L^{100}$ represents a hydrogen atom, a substituted or unsubstituted alkyl group, a substituted or unsubstituted alkenyl group, a substituted or unsubstituted alkynyl group, a substituted or unsubstituted aryl group, or a substituted or unsubstituted heteroaryl group.

In Formula (I) above, as the substituent having the polymerizable group represented by Z, for example, a substituent containing a (meth)acrylate group, a styryl group, a vinyl ketone group, a butadiene group, a vinyl ether group, an oxiranyl group, an aziridinyl group, or an oxetane group may exemplified.

Among these, a substituent including a (meth)acrylate group, a styryl group, an oxiranyl group, or an oxetane group is preferable and a substituent including a (meth)acrylate group or a styryl group is more preferable.

Particularly, a substituent including a (meth)acrylate group is preferably a group having an ethylenically unsaturated double bond represented by Formula (V) below.

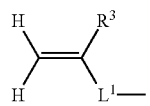                                    Formula (V)

In Formula (V) above, $R^3$ represents a hydrogen atom or a methyl group and preferably represents a hydrogen atom.

In addition, in Formula (V), $L^1$ represents a single bond or a divalent linking group selected from the group consisting of —O—, —CO—, —NH—, —CO—NH—, —COO—, —O—COO—, an alkylene group, arylene group, a heterocyclic group, and combination of these, a single bond, —CO—NH—, or —COO— is preferable and a single bond or —CO—NH— is particularly preferable.

In Formula (I) above, n represents an integer of 0 to 4, preferably represents 0 or 1, and more preferably represents 1.

Further, m represents 1 or 2 and preferably represents 1.

For $L^{100}$, examples of divalent linking groups include a single bond or a divalent linking group selected from —O—, —CO—, —NH—, —CO—NH—, —COO—, —O—COO—, an alkylene group, arylene group, a heteroaryl group, and combination of these groups.

Among these, a substituted or unsubstituted arylene group is more preferable.

The alkyl group, the alkenyl group, the alkynyl group, the aryl group, and the heteroaryl group represented by $L^{100}$ have the same meaning as $R^1$ and $R^2$ in Formula (VI) below and the preferable ranges thereof are the same.

In addition, examples of the substituents of these groups include substituents described in paragraph [0046] of JP2013-054201A.

In Formula (I) above, Q is a substituent containing at least one boron atom and is preferably a group that can be bonded to the polymer film by adsorption.

For examples, in a case where the polymer film has a hydroxyl group or a carboxyl group on the surface thereof by a surface treatment or the like, a group that can be bonded to the hydroxyl group or the carboxyl group of the polymer film is preferable.

The term "group that can be bonded to the polymer film by adsorption" means a group interacting with the structure of the material constituting the polymer film to be chemically adsorbed onto the polymer film.

As the substituent containing at least one boron atom, a substituent represented by Formula (VI) below may be exemplified.

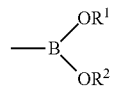                                    Formula (VI)

In Formula (VI) above, $R^1$ and $R^2$ each independently represent a hydrogen atom, a substituted or unsubstituted aliphatic hydrocarbon group, a substituted or unsubstituted aryl group, or a substituted or unsubstituted heteroaryl group.

In addition, $R^1$ and $R^2$ in Formula (VI) above may constitute an alkylene group, an aryl group, or a linking group formed by combination of these groups by linking $R^1$ and $R^2$.

In Formula (VI) above, the substituted or unsubstituted aliphatic hydrocarbon group represented by each of $R^1$ and $R^2$ includes a substituted or unsubstituted alkyl group, an alkenyl group, and an alkynyl group.

Specific examples of the alkyl group include linear, branched or cyclic alkyl groups such as a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, a sec-butyl group, a tert-butyl group, an isopentyl group, a neopentyl group, a 1-methylbutyl group, an isohexyl group, a 2-methylhexyl group, a cyclopentyl group, a cyclohexyl group, a 1-adamantyl group, and a 2-norbornyl group.

Specific examples of the alkenyl group include linear, branched or cyclic alkenyl groups such as a vinyl group, a 1-propenyl group, a 1-butenyl group, a 1-methyl-1-propenyl group, a 1-cyclopentenyl group, and a 1-cyclohexenyl group.

Specific examples of the alkynyl group include an ethylnyl group, a 1-propynyl group, a 1-butynyl group, and a 1-octynyl group.

Specific examples of the aryl group include an aryl group where a fused ring is formed by 1 to 4 benzene rings, an aryl group where a fused ring is formed by a benzene ring and an unsaturated 5-membered ring. Specific examples thereof include a phenyl group, a naphthyl group, an anthryl group, a phenanthryl group, an indenyl group, an acenaphthenyl group, a fluorenyl group, and a pyrenyl group.

Examples of the substituted or unsubstituted heteroaryl group represented by each of $R^1$ and $R^2$ in Formula (VI) above include a heteroaryl group resulting from eliminating one hydrogen atom on a heteroaromatic ring containing one or more hetero atom selected from the group consisting of a nitrogen atom, an oxygen atom, and a sulfur atom.

Specific examples of the heteroaromatic ring containing one or more hetero atom selected from the group consisting of a nitrogen atom, an oxygen atom, and a sulfur atom include pyrrole, furan, thiophene, pyrazole, imidazole, triazole, oxazole, isooxazole, oxadiazole, thiazole, thiadiazole, indole, carbazole, benzofuran, dibenzofuran, thianaphthene, dibenzothiophene, indazole benzimidazole, anthranyl, benzisooxazole, benzoxazole, benzothiazole, purine, pyridine, pyridazine, pyrimidine, pyrazine, triazine, quinoline, acridine, isoquinoline, phthalazine, quinazoline, quinoxaline, naphthylidine, phenanthroline, and pteridine.

In Formula (VI) above, $R^1$ and $R^2$ preferably each represent a hydrogen atom.

$R^1$ and $R^2$ in Formula (VI) above and $L^{100}$ in Formula (I) above may be substituted by one or more substituents, if possible. These hydrocarbon groups may be substituted by one or more random substituents. Examples of the substituent include monovalent non-metallic atom groups except for hydrogen.

The molecular weight of the compound represented by Formula (I) above is preferably 120 to 1200 and more preferably 180 to 800.

Specific examples of the compound represented by Formula (I) above include compounds exemplified in paragraphs [0035] to [0040] of JP2007-219193A as specific examples as well as the following compounds, and the contents thereof are incorporated in the present specification. The present invention is of course not limited to these specific examples.

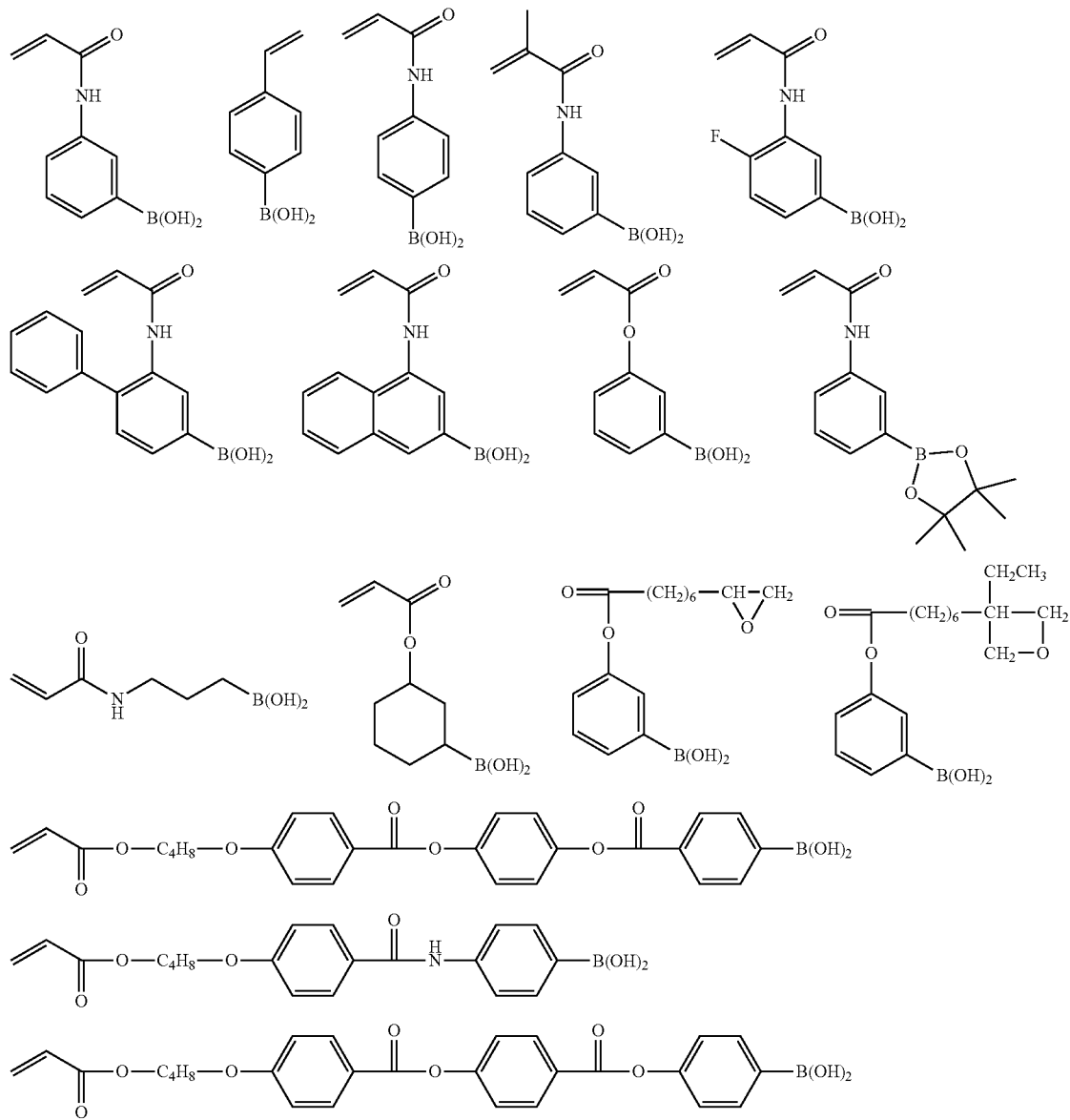

-continued

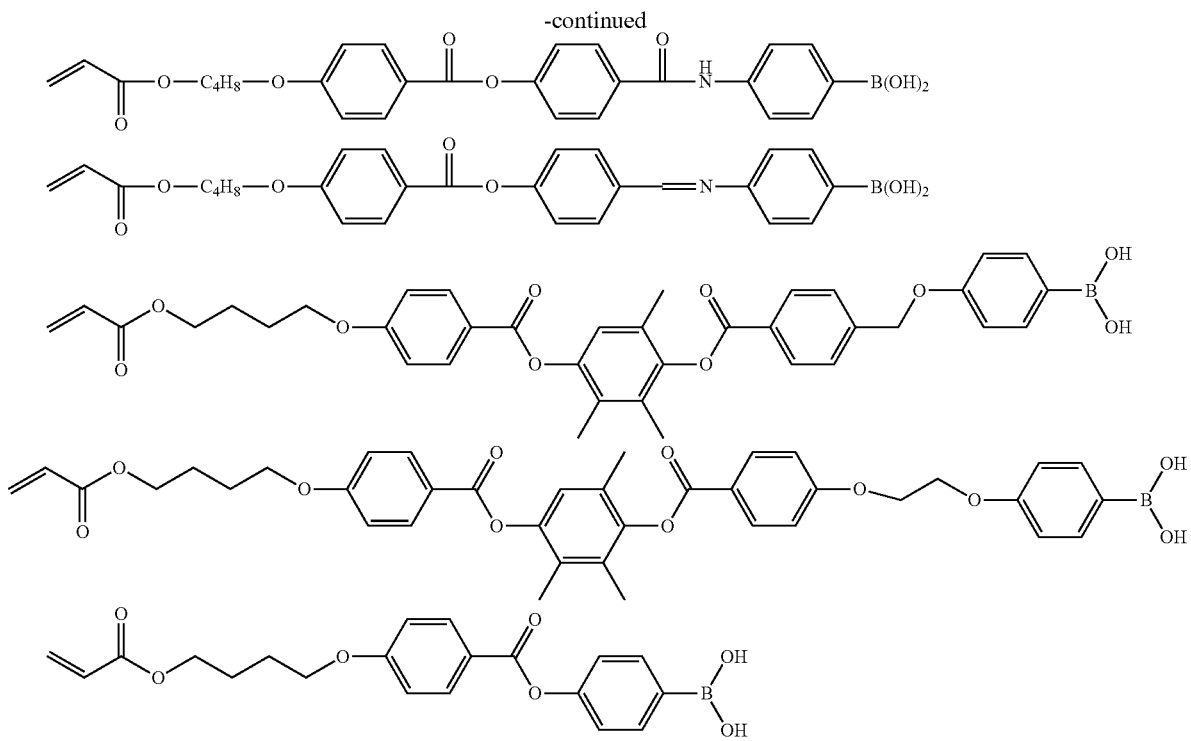

The content of the compound represented by Formula (I) above is 0.5% to 7% by mass with respect to the mass of the liquid crystal compound in the liquid crystal composition as described above and is preferably 1% to 5% by mass and more preferably 3% to 5% by mass.

In a case where the mixing amount of the compound represented by Formula (I) above is 0.5% by mass or more, the adhesiveness can be improved and in a case where the mixing amount of the compound is 7% by mass or less, the alignment can be improved.

When a plurality of liquid crystal compounds are contained, the amount of the compound is a ratio with respect to the total amount of plurality of liquid crystal compounds.

In the present invention, it is preferable that the compound represented by Formula (I) above is unevenly distributed in the liquid crystal layer on a side close to the polymer film in the film thickness direction.

Here, the term "uneven distribution" is a concept including, in addition to a case where the compound is unevenly distributed as it is, uneven distribution of reaction products after polymerization in a case where the liquid crystal layer is a polymer of a liquid crystal composition.

Specifically, in the optical film according to the first aspect of the optical films according to the aspects of the present invention, an eccentricity value represented by Expression (1-1) described later satisfies 20% to 80%, and in the optical film according to the second aspect, the peak intensity ratio represented by Expression (1-2) described later satisfies 1.1 to 5.0.

$$S_{0.1}/S_{total} \times 100\% \qquad \text{Expression (1-1)}$$

In Expression (1-1) above, $S_{total}$ represents an integrated value of $BO_2^-$ secondary ion intensity detected by time-of-flight secondary ion mass spectrometry (TOF-SIMS).

In addition, $S_{0.1}$ represents an integrated value of $BO_2^-$ secondary ion intensity detected by TOF-SIMS in a region from the interface of the liquid crystal layer with the polymer film to a distance of 1/10 of the film thickness of the liquid crystal layer.

The reason for detecting $BO_2^-$ in TOF-SIMS is that the $BO_2^-$ secondary ion intensity to be detected is mainly the secondary ion intensity derived from the boron atom of the compound represented by Formula (I) above in the liquid crystal layer.

$$P_1/P_{ave} \qquad \text{Expression (1-2)}$$

In Expression (1-2) above, $P_1$ represents a peak intensity present on the side closest to the polymer film among the peaks of $BO_2^-$ secondary ion intensity detected by TOF-SIMS.

$P_{ave}$ represents an average value of the $BO_2^-$ secondary ion intensity detected by TOF-SIMS on a side more apart from the polymer film than from the peak position where the peak intensity of $P_1$ is calculated. However, the secondary ion intensity with the peak closest to a surface of the liquid crystal layer opposite to the surface on which the polymer film is provided is excluded from the calculation of $P_{ave}$.

Here, as the measurement method of TOF-SIMS, first, the surface secondary ion intensity on the surface of the liquid crystal layer is measured by using TOF-SIMS. Next, the surface of the measurement surface is etched by using a sputter gun, and the secondary ion intensity of the etched surface is measured. Then, a cycle of etching and measurement is repeated at the interface of the liquid crystal layer on the polymer film side, and a distribution (mapping) of the secondary ion intensity is made and used to calculate the above-described integrated value of secondary ion intensity and the peak intensity.

In addition, as the measurement conditions of TOF-SIMS, the measurement is performed in a measurement range of 100 mm² using TRIFT V nano TOF (trade name) manufactured by ULVAC-PHI in a high mass resolution mode and integration 5 times/cycle. A low speed electron gun is used for electrification correction and Ar-GCIB (Ar2500+, 20 kV, 2 nA) is used in 500 mm$^2$ and 5 s/cycle for etching.

In addition, the boron atom of the compound represented by Formula (I) above present in the liquid crystal layer is observed by detecting a fragment ($BO_2^-$).

In a case where the eccentricity value represented by Expression (1-1) above satisfies 20% to 80% or the peak intensity ratio represented by Expression (1-2) above satisfies 1.1 to 5.0, the adhesiveness between the polymer film and the liquid crystal layer can be effectively improved.

By adjusting the kind of the compound represented by Formula (I) above, the water contact angle of the surface of the above-described polymer film, or the kind of solvent included in the liquid crystal composition, the eccentricity value and the peak intensity ratio can be adjusted.

{Other Additives}

Other additives may be mixed with the liquid crystal layer of the optical film of the present invention or the liquid crystal composition for forming the liquid crystal layer within a range not departing from the spirit of the present invention.

Examples of other additives include a vertical alignment agent. As the vertical alignment agent, a pyridinium compound and an onium compound are preferably used. By incorporating these compounds therein, the compounds function as a vertical alignment agent for promoting vertical alignment at the polymer film interface of the liquid crystal compound and contribute to improving the adhesiveness of the interface between the liquid crystal layer in which the alignment state of the liquid crystal compound is fixed and the polymer film. As the pyridinium compound, for example, the description of paragraphs [0030] to [0052] of JP2007-093864A can be referred to, as the onium compound, for example, the description of paragraphs [0027] to [0058] of JP2012-208397A can be referred to, and the contents thereof are incorporated in the present specification.

The liquid crystal layer in which the alignment state of the liquid crystal compound is fixed may contain an air interface side alignment controlling agent (for example, a copolymer including a repeating unit having a fluoroaliphatic group) for controlling the alignment on the air interface side, if necessary.

In addition, for example, a polymerization initiator can be mixed with the liquid crystal composition. As the polymerization initiator, the descriptions of paragraphs [0099] and [0100] of JP2010-84032A and paragraphs [0065] to [0067] of JP2007-219193A can be referred to, and the contents thereof are incorporated in the present specification. Examples of commercially available products of the polymerization initiator include IRGACURE 907, IRGACURE 184, IRGACURE 819, IRGACURE TPO, IRGACURE OXE 01, IRGACURE OXE 02, IRGACURE 127, and IRGACURE 2959 (manufactured by BASF SE). Two or more polymerization initiators may be used in combination. In addition, various sensitizers such as benzophenones and thioxanthones and various chain transfer agents can be used in combination. As the chain transfer agent, thiols may be exemplified and examples of commercially available products thereof KARENZ MT (registered trademark, the same hereinafter), PE1, BD1, and NR1 (manufactured by Showa Denko K. K.).

In addition, the liquid crystal composition may contain a non-liquid crystal polymerizable monomer. As the polymerizable monomer, a compound having a vinyl group, a vinyloxy group, an acryloyl group or a methacryloyl group is preferable. Specific examples of a polyfunctional monomer having two or more polymerizable reactive functional groups include esters of polyhydric alcohols and (meth) acrylic acids [for example, ethylene glycol di(meth)acrylate, butanediol di(meth)acrylate, hexanediol di(meth)acrylate, 1,4-cyclohexane diacrylate, and pentaerythritol tetra(meth) acrylate, pentaerythritol tri(meth)acrylate, trimethylolpropane tri(meth)acrylate, trimethylolethane tri(meth)acrylate, dipentaerythritol tetra(meth)acrylate, dipentaerythritol penta (meth)acrylate, dipentaerythritol hexa(meth)acrylate, pentaerythritol hexa(meth)acrylate, 1,2,3-cyclohexane tetramethacrylate, polyurethane polyacrylate, and polyester polyacrylate], the ethylene oxide-modified products, vinylbenzene, and derivatives thereof (for example, 1,4-divinylbenzene, 4-vinylbenzoic acid-2-acryloylethyl ester, and 1,4-divinylcyclohexanone), vinylsulfone (for example, divinylsulfone), acrylamide (for example, methylenebisacrylamide), and methacrylamide. These monomers may be used in combination of two or more thereof.

<Method for Producing Optical Film>

A method for producing an optical film of the present invention (hereinafter, simply abbreviated as "production method of the present invention") includes a surface treatment step of subjecting a surface of a polymer film including a cycloolefin-based polymer to a surface treatment so as to have a water contact angle of 5° to 65°, and a liquid crystal layer forming step of bringing a liquid crystal composition including a liquid crystal compound, the compound represented by Formula (I) above, and a solvent into contact with the surface-treated surface and then forming a liquid crystal layer thereon.

The liquid crystal composition is a composition in which the content of the compound represented by Formula (I) above is 0.5% to 7.0% by mass with respect to the mass of the liquid crystal compound.

[Surface Treatment Step]

The surface treatment step of the production method of the present invention is a step of subjecting a surface of a polymer film to a surface treatment so as to have a water contact angle of 5° to 65°. The measurement method of the water contact angle is as described above.

In addition, it is preferable that the surface treatment step is a step of adding a hydroxyl group or a carboxyl group to the surface of the polymer film. As specific means, various known means can be used and a corona treatment is preferable.

{Corona Treatment}

The corona treatment can be performed by, for example, treatment methods described in JP1964-12838B (JP-S39-12838B), JP1972-19824A (JP-S47-19824A), JP1973-28067A (JP-S48-28067A), and JP1977-42114A (JP-S52-42114A). As a corona treatment device, a solid state corona treatment machine manufactured by Pillar Corporation, a LEPEL type surface treatment machine, a VETAPHON type treatment machine, and the like can be used. The treatment can be conducted at normal pressure under air. The gap clearance between an electrode and a dielectric roll is 0.1 mm to 10 mm and more preferably 1.0 mm to 2.0 mm. The discharge treatment is performed above a dielectric support roller provided in a discharge band and the treatment amount is 10 W·min/m$^2$ to 1000 W·min/m$^2$, preferably 20 W·min/m$^2$ to 500 W·min/m$^2$, and more preferably 30 W·min/m$^2$ to 250 W·min/m$^2$.

[Liquid Crystal Layer Forming Step]

The liquid crystal layer forming step of the production method of the present invention is a step of bringing a liquid crystal composition including a liquid crystal compound, the compound represented by Formula (I) above, and a solvent into contact with the surface-treated surface and then forming a liquid crystal layer.

The method of bringing the liquid crystal composition into contact with the surface is not particularly limited and various known methods such as coating can be used.

In addition, in the liquid crystal layer forming step, it is preferable to fix the liquid crystal compound by irradiation with ultraviolet rays in an air atmosphere.

Here, from the viewpoint of controlling the above-described infiltration layer, it is preferable that the solvent is a solvent not having dissolving ability and swelling ability with respect to a polymer film. The solvent not having dissolving ability and swelling ability with respect to a polymer film refers to a solvent having a low compatibility with a polymer film and can be appropriately used according to the dissolving ability and swelling ability with respect to a polymer film.

A solvent having dissolving ability with respect to a polymer film means a solvent as follows: A polymer film having a size of 24 mm×36 mm (thickness 80 µm) is immersed in a bottle of a capacity of 15 cm$^3$ containing the solvent at room temperature (25° C.) for 60 seconds and is taken out from the bottle. In a case where the immersed solution is analyzed by gel permeation chromatography (GPC) and then the peak surface area of the polymer film component is 400 mV/sec or more, such a solvent is a solvent having dissolving ability with respect to the polymer film.

A solvent having swelling ability with respect to a polymer film means a solvent as follows: A polymer film having a size of 24 mm×36 mm (thickness 80 µm) is immersed in a bottle of a capacity of 15 cm$^3$ containing the solvent at a temperature of 25° C. for 60 seconds. In a case where bending or deformation of the polymer film is observed by appropriately shaking the bottle, such a solvent is a solvent having swelling ability with respect to a polymer film. The swollen part of a polymer film is followed by a change in the dimension and is observed as bending or deformation. A change such as bending or deformation is not observed with a solvent free from swelling ability.

Examples of the solvent preferably used in the present invention include methanol, ethanol, cyclohexanone, acetone, methyl isobutyl ketone, methyl acetate, propylene glycol monomethyl ether, and propylene glycol monomethyl ether acetate. These can be used singly or in combination of two or more thereof.

On the other hand, whether the solvent has dissolving ability or swelling ability with respect to a polymer film is affected by the production method in a case of producing a polymer film as well as a combination of the polymer film component and the solvent and thus it is preferable to select a solvent according to the polymer film. An ester-based solvent such as methyl acetate and an ether-based solvent such as propylene glycol monomethyl ether can be preferably used since a balance between the dissolving ability or swelling ability with respect to the polymer film and the dissolution stability of the liquid crystal compound is excellent.

<Polarizing Plate>

A polarizing plate of the present invention has the above-described optical film of the present invention and a polarizer.

On the surface of the polarizer opposite to the surface on which the optical film is provided, another optical film may be provided, and a curable resin layer may be arranged or may be directly laminated with another member of an image display device described later.

The optical film of the present invention may be arranged on the polymer film side as a polarizer side or may be arranged on the liquid crystal layer side as a polarizer side.

The polarizer and the optical film can be laminated using an adhesive.

The thickness of an adhesive layer between the polarizer and polarizing plate protective films on both surfaces is preferably about 0.01 to 30 µm, more preferably 0.01 to 10 µm, and even more preferably 0.05 to 5 µm. In a case where the thickness of the adhesive layer is within this range, floating or peeling does not occur between the optical film and the polarizer to be laminated and adhesion without practical problems is obtained.

As one preferable adhesive, an aqueous adhesive, that is, an adhesive of which the adhesive component is dissolved or dispersed in water can be used, and an adhesive formed of an aqueous polyvinyl alcohol-based resin solution is preferably used.

Polyvinyl alcohol-based resins as the adhesive formed of an aqueous polyvinyl alcohol-based resin solution include as well as a vinyl alcohol homopolymer obtained by subjecting polyvinyl acetate which is a homopolymer of vinyl acetate to a saponification treatment, a vinyl alcohol-based copolymer obtained by subjecting a copolymer of vinyl acetate and other monomers which can be copolymerized therewith to a saponification treatment, a modified polyvinyl alcohol-based polymer obtained by partially modifying hydroxyl groups thereof, and the like.

Polyvalent aldehyde, a water-soluble epoxy compound, a melamine-based compound, a zirconia compound, a zinc compound, a glyoxylic acid salt, or the like may be added to the adhesive as a crosslinking agent. In a case where a water-based adhesive is used, the thickness of the adhesive layer obtained from the adhesive is commonly 1 µm or less.

Examples of other preferable adhesives include a curable adhesive composition cured by irradiation with an active energy ray (for example, ultraviolet rays) or heating and containing a cationically polymerizable compound, and a curable adhesive composition containing a radically polymerizable compound. Particularly, an ultraviolet curable adhesive is preferably used for lamination with the liquid crystal layer having the polarizer and the optical film. Examples of the cationically polymerizable compound include compounds having an epoxy group and an oxetanyl group. The epoxy compound is not particularly limited as long as the compound has at least two epoxy groups in a molecule. For example, compounds described in detail in JP2004-245925A can be used.

The radically polymerizable compound is not particularly limited as long as the radically polymerizable compound is a radically polymerizable compound having an unsaturated double bond such as a (meth)acryloyl group and a vinyl group. Examples thereof include a monofunctional radically polymerizable compound, a polyfunctional radically polymerizable compound having two or more polymerizable groups in a molecule, a (meth)acrylate having a hydroxyl group, acrylamide, and acryloylmorpholine. These compounds may be used singly or in combination of two or more thereof. For example, compounds described in detail in JP2015-11094A can be used. In addition, the radically polymerizable compound and the cationically polymerizable compound can be used in combination.

In a case of using the curable adhesive, the films are laminated using a lamination roller and then dried, if necessary. Then, the laminate is irradiated with an active energy ray or heated to cure the curable adhesive. The light source of the active energy ray is not particularly limited but an active energy ray having a light emission distribution at a wavelength of 400 nm or less is preferable. Specifically, a low pressure mercury lamp, a medium pressure mercury lamp, a high pressure mercury lamp, an ultra-high pressure mercury lamp, a chemical lamp, a black light lamp, a microwave excitation mercury lamp, a metal halide lamps, and the like are preferably used.

Upon laminating the polarizer and the optical film with an adhesive, in order to improve adhesion strength and wettability of the adhesive to the surface of the optical film, the surface of the optical film facing the polarizer may be subjected to a surface treatment (for example, a glow discharge treatment, a corona discharge treatment, or an ultraviolet (UV) treatment), easily adhesive layer formation, and the like. Materials and formation methods for an easily adhesive layer described in JP2007-127893A can be used.

In a case where the liquid crystal layer side of the optical film and the polarizer are laminated with an adhesive formed of an aqueous polyvinyl alcohol-based resin solution, it is preferable to improve adhesion strength by subjecting the surface of the liquid crystal layer to a glow discharge treatment or a corona discharge treatment and adding an additive exhibiting high affinity with polyvinyl alcohol to the liquid crystal layer.

In addition, in a case where the liquid crystal layer side of the optical film and the polarizer are laminated with an adhesive cured by irradiation with an active energy ray or heating, it is preferable to subject the surface of the liquid crystal layer to a glow discharge treatment or a corona discharge treatment from the viewpoint of improving adhesion strength and wettability of the adhesive to the surface of the optical film. Further, the optical film is prepared in a state in which the liquid crystal layer is half-cured, and in a case where the optical film is laminated with the polarizer by adhesion, the liquid crystal layer is fully cured by irradiation with an active energy ray or heating so that high adhesiveness can be obtained.

In addition, the polarizing plate of the present invention may have a protective film.

In a case where the polarizing plate has a protective film, the protective film may be arranged between the polarizer and the optical film and on the surface of the optical film opposite to the polarizer through a pressure sensitive adhesive or an adhesive.

[Polarizer]

The polarizer of the polarizing plate of the present invention is not particularly limited and may be a so-called linear polarizer having a function of converting natural light into specific linearly polarized light. The polarizer is not particularly limited and absorptive type polarizers can be used.

The material of the polarizer that is used in the present invention is not particularly limited, commonly used polarizers can be used, and, for example, any of iodine-based polarizers, dye-based polarizers for which dichroic dyes are used, and polyene-based polarizers can be used.

In the present invention, the thickness of the polarizer is not particularly limited but is preferably 3 μm to 60 μm, more preferably 5 μm to 30 μm, and even more preferably 5 μm to 15 μm.

[Protective Film]

The material of the protective film is not particularly limited and examples thereof include cellulose acylate film (for example, a cellulose triacetate film, a cellulose diacetate film, a cellulose acetate butyrate film, and a cellulose acetate propionate film), films of polyacrylic resins such as polymethyl methacrylates, polyolefins such as polyethylene and polypropylene, films of polyester-based resins such as polyethylene terephthalate and polyethylene naphthalate, polyether sulfone films, polyurethane-based resin films, polyester films, polycarbonate films, polysulfone films, polyether films, polymethylpentene films, polyetherketone films, (meth)acrylonitrile films, polyolefins, polymers having an alicyclic structure (norbornene-based resins (trade name: ARTON, manufactured by JSR Corporation), amorphous polyolefins (trade name: ZEONEX, manufactured by Zeon Corporation)), and the like. Among these, a cellulose acylate film is preferable.

It is preferable that the optical properties of the protective film satisfy Expression (8) and Expression (9) below since display performance in a case of using the polarizing plate of the present invention in an image display device is improved.

$0 \text{ nm} \leq Re3(550) \leq 10 \text{ nm}$      Expression (8)

$-40 \text{ nm} \leq Rth3(550) \leq 40 \text{ nm}$      Expression (9)

Particularly, in a case where a protective film is provided between the optical film of the present invention and the polarizer or on the surface of the optical film opposite to the polarizer, the protective film is preferably a wavelength dispersion compensation layer satisfying optical properties of Expression (10) and Expression (1) below.

$3 \text{ nm} \leq |Rth(450)-Rth(550)| \leq 30 \text{ nm}$      Expression (10)

$0 \text{ nm} \leq |Rth(450)| < 30 \text{ nm or } 0 \text{ nm} \leq |Rth(550)| < 30 \text{ nm}$      Expression (11)

By forming a polarizing plate by laminating the polarizer, the protective film satisfying Expression (10) and Expression (11) above, and the optical film of the present invention, refractive index wavelength dispersibility is corrected and thus an ideal optical compensation can be realized over the entire visible light wavelength range.

<Image Display Device>

An image display device of the present invention has the above-described polarizing plate of the present invention and an image display element.

In addition, it is preferable that the image display device of the present invention is an image display device having the above-described polarizing plate of the present invention, an image display element, and a facing polarizing plate, in which the image display element is a liquid crystal cell, the facing polarizing plate is a facing polarizing plate having a polarizer and a protective film (wavelength dispersion compensation layer) satisfying Expression (10) and Expression (11) above and is arranged such that the protective film is disposed on a liquid crystal cell side.

$3 \text{ nm} \leq |Rth3(450)-Rth3(550)| \leq 30 \text{ nm}$      Expression (10)

$0 \text{ nm} \leq |Rth3(450)| < 30 \text{ nm or } 0 \text{ nm} \leq |Rth3(550)| < 30 \text{ nm}$      Expression (11)

[Image Display Element]

The image display element used in the present invention is not particularly limited and examples thereof include a liquid crystal cell, an organic electroluminescent (hereinafter, abbreviated as "EL") display panel, and a plasma display panel.

Among these, a liquid crystal cell or an organic EL display panel is preferable and a liquid crystal cell is more preferable. That is, as the image display device of the present invention, a liquid crystal display device using a liquid crystal cell as an image display element, or an organic EL display device using an organic EL display panel as an image display element is preferable and a liquid crystal display device is more preferable.

{Liquid Crystal Cell}

The liquid crystal cell used in the liquid crystal display device is preferably of a vertical alignment (VA) mode, an optical compensated bend (OCB) mode, a FFS or in-plane-switching (IPS) mode, or a twisted nematic (TN) mode but the liquid crystal cell mode is not limited thereto.

In a TN mode liquid crystal cell, rod-like liquid crystal molecules are aligned substantially horizontally in a case where no voltage is applied and are further aligned in a twisted manner in a range of 60° to 120°. The TN mode liquid crystal cell is most often used in a color thin film transistor (TFT) liquid crystal display device and is mentioned in many literatures.

In a VA mode liquid crystal cell, rod-like liquid crystal molecules are aligned substantially vertically in a case where no voltage is applied. Examples of the VA mode liquid crystal cells include (1) a narrowly defined VA mode liquid crystal cell (described in JP1990-176625A (JP-H02-176625A)) in which rod-like liquid crystal molecules are aligned substantially vertically in a case where no voltage is applied and are aligned substantially horizontally in a case where a voltage is applied, (2) a multi-domain VA mode (MVA mode) liquid crystal cell for enlarging the viewing angle (SID97, Digest of Tech. Papers (Proceedings) 28 (1997) 845), (3) a liquid crystal cell in a mode (n-ASM mode) in which rod-like liquid crystal molecules are aligned substantially vertically in a case where no voltage is applied and are aligned in twisted multi-domain alignment in a case where a voltage is applied (Proceedings of Japanese Liquid Crystal Conference, 58 and 59 (1998)), and (4) a SURVIVAL mode liquid crystal cell (presented in LCD International 98). The liquid crystal cell may be of any of a patterned vertical alignment (PVA) type, an optical alignment type, and a polymer-sustained alignment (PSA) type. These modes are described in detail in JP2006-215326A and JP2008-538819A.

In an IPS mode liquid crystal cell, rod-like liquid crystal molecules are aligned substantially parallel with respect to a substrate and application of an electric field parallel to the substrate surface causes the liquid crystal molecules to respond planarly. The IPS mode displays black in a case where no electric field is applied and a pair of upper and lower polarizing plates have absorption axes which are orthogonal to each other. A method for improving the viewing angle by reducing light leakage during black display in an oblique direction using an optical compensation sheet is described in JP1998-54982A (JP-H10-54982A), JP1999-202323A (JP-H11-202323A), JP1997-292522A (JP-H09-292522A), JP1999-133408A (JP-H11-133408A), JP1999-305217A (JP-H11-305217A), JP1998-307291A (JP-H10-307291A), and the like.

{Organic EL Display Panel}

The organic EL display panel which is used as the image display element used in the present invention is a display panel configured using an organic EL element in which an organic light emitting layer (organic electroluminescent layer) is sandwiched between electrodes (between a cathode and an anode). The configuration of the organic EL display panel is not particularly limited but any known configuration is adopted.

EXAMPLES

Hereinafter, the present invention will be described in detail based on examples. It is to be noted that any materials, reagents, amounts and ratios of the materials, and operations shown in the examples below can be modified as appropriate without departing from the spirit of the present invention. Therefore, the present invention should not be construed as being limited to the following examples.

Example 1

<Preparation of Optical Film>

One surface of a cycloolefin polymer film (trade name: ARTON FILM, Re=95 nm, Rth=100 nm, film thickness 20 μm, manufactured by JSR Corporation) was subjected to a corona treatment in a discharge amount of 125 W·min/m² and a liquid crystal layer forming composition 1 prepared with the following composition was applied to the corona-treated surface using a #3.0 wire bar.

Next, the solvent of the composition was dried and heated with hot air at 70° C. for 90 seconds to mature the alignment of the liquid crystal compound.

Next, irradiation with ultraviolet rays (300 mJ/cm²) was performed at 40° C. in an oxygen concentration of 0.1% under nitrogen purge and the alignment of the liquid crystal compound was fixed. Thus, an optical film of Example 1 was prepared.

| Liquid Crystal Layer Forming Composition 1 | |
|---|---|
| Liquid crystal compound R1 below | 100.0 parts by mass |
| Alignment assistant (A1) below | 1.0 part by mass |
| Compound B1 represented by Formula (I) below | 1.0 part by mass |
| Polymerization initiator (P1) below | 3.0 parts by mass |
| Sensitizer (P2) below | 1.0 part by mass |
| Surfactant (S1) below | 0.4 parts by mass |
| Methyl acetate | 250.0 parts by mass |

Liquid crystal compound R1

Mixture of liquid crystal compounds (RA), (RB), and (RC) below at 83:15:2 (mass ratio)

(RA)

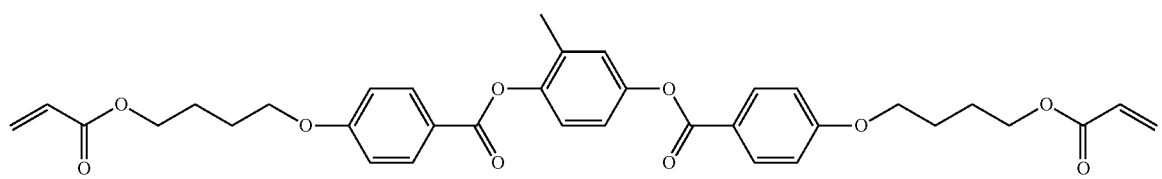

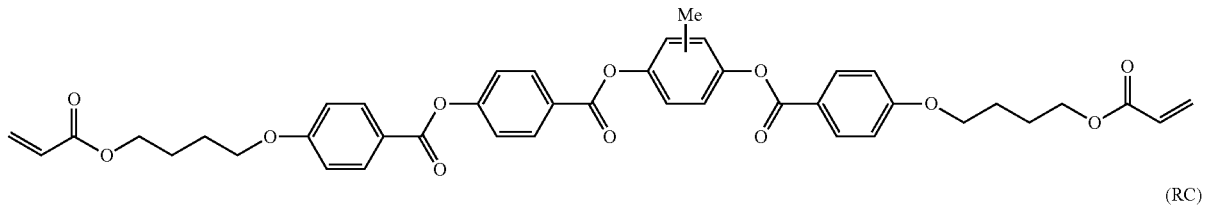
(RB)

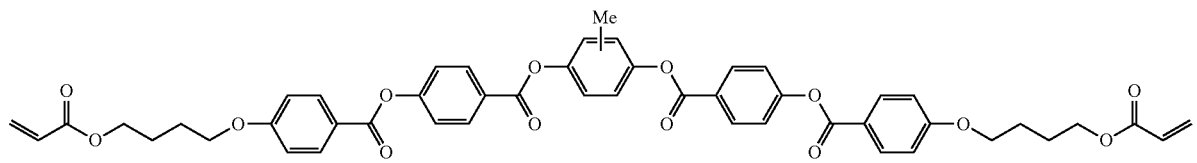
(RC)

Alignment assistant A1

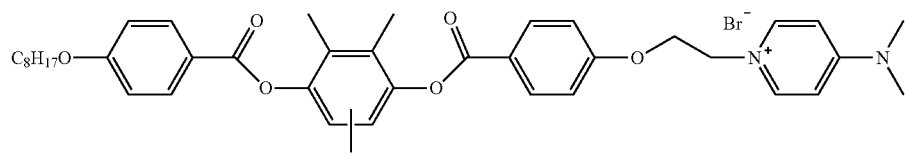

Compound B1 represented by Formula (I)

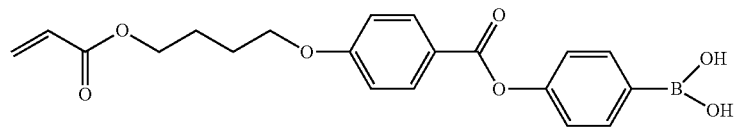 [SMILES: C=CC(=O)OCCCCOc1ccc(C(=O)Oc2ccc(B(O)O)cc2)cc1]

Polymerization initiator P1

Sensitizer P2

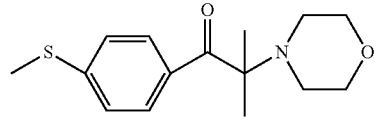 [SMILES: CSc1ccc(C(=O)C(C)(C)N2CCOCC2)cc1]

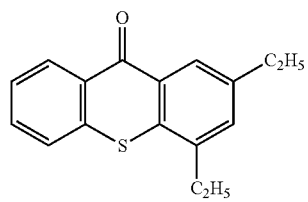 [SMILES: CCc1cc(CC)c2sc3ccccc3c(=O)c2c1]

Surfactant S1

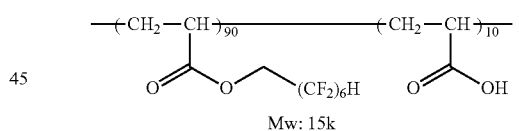

Mw: 15k

Numerical value in structure is % by mass

Regarding the optical film prepared above, the film thickness, Re(550), and Rth(550) of the polymer film, the water contact angle, the film thickness, Re(550), and Rth(550) of the liquid crystal layer, and the eccentricity value of the compound represented by Formula (I) above were measured in the above-described methods. The results are shown in Table 1 below.

<Evaluation>

[Evaluation of Alignment]

Regarding the liquid crystal layer of the prepared optical film, a value of |Rth(550)| with respect to a film thickness of 1 μm of the liquid crystal layer was calculated and evaluated based on the following standards. In a case where the liquid crystal compound is identical, as the alignment becomes higher, the value of |Rth(550)| with respect to a film thickness of 1 μm of the liquid crystal layer increases.

Accordingly, the alignment was evaluated at the value of |Rth(550)| with respect to a film thickness of 1 μm of the liquid crystal layer. The result is shown in Table 1 below.

A: more than 110 nm/μm

B: more than 100 nm/μm and 110 nm/μm or less

C: 100 nm/μm or less

[Evaluation of Adhesiveness]

Eleven slits were made on the liquid crystal layer side of the prepared optical film lengthwise and crosswise at 1-mm intervals and hundred 1-mm square crosscuts were made.

CELLOTAPE (registered trademark), manufactured by Nichiban Co., Ltd., was attached onto the crosscuts with pressure, left to stand for 1 minute, and then peeled off vigorously. Whether or not the liquid crystal layer was peeled off was visually observed. A case where the liquid crystal layer was peeled off in an area of ¼ or more of each grid (0.25 mm² or more) was considered as a peeled-off grid and the number of peeled-off grids was counted to evaluate the adhesiveness between the liquid crystal layer and the polymer film based on the following standards. The result is shown in Table 1 below.

A: 80 to 100 grids

B: 51 to 79 grids

C: 0 to 50 grids

TABLE 1

| | Polymer film | | | | Liquid crystal layer | | | | | | | | | | Evaluation | |
|---|---|---|---|---|---|---|---|---|---|---|---|---|---|---|---|---|
| | | | | | | Compound represented by Formula (I) | | | | | | | | |Rth(550)| with respect to film thickness of 1 μm [nm] | Re(550) with respect to film thickness of 1 μm [nm] | | |
| | Kind | Thickness [μm] | Re(550) [nm] | Rth(550) [nm] | Water contact angle [°] | Liquid crystal compound | Kind | Added amount [% by mass] | Eccentricity value | Peak intensity ratio | Thickness [μm] | Thickness of infiltration layer [μm] | Re(550) [nm] | Rth(550) [nm] | | | Alignment | Adhesiveness |
| Example 1 | ARTON | 20 | 95 | 100 | 48 | R1 | B1 | 1 | 43% | 2.3 | 1.3 | 0.25 | 0 | −160 | 123 | — | A | A |
| Example 2 | ARTON | 23 | 100 | 100 | 54 | R1 | B1 | 0.5 | 40% | 4.2 | 1.3 | 0.25 | 0 | −160 | 123 | — | A | B |
| Example 3 | ARTON | 15 | 95 | 100 | 54 | R1 | B1 | 3 | 40% | 1.5 | 1.0 | 0.25 | 0 | −120 | 120 | — | A | A |
| Example 4 | ARTON | 23 | 116 | 79 | 50 | R1 | B1 | 5 | 38% | 1.3 | 1.4 | 0.25 | 0 | −160 | 114 | — | B | A |
| Example 5 | ARTON | 25 | 116 | 79 | 49 | R1 | B1 | 7 | 35% | 1.2 | 1.2 | 0.25 | 0 | −130 | 108 | — | A | A |
| Example 6 | ARTON | 24 | 80 | 120 | 50 | R1 | B2 | 1.5 | 39% | 2.4 | 1.4 | 0.25 | 0 | −165 | 118 | — | A | A |
| Example 7 | ARTON | 25 | 130 | 65 | 50 | R1 | B3 | 1 | 43% | 1.8 | 1.0 | 0.25 | 0 | −115 | 115 | — | A | A |
| Example 8 | ARTON | 25 | 120 | 60 | 52 | R1 | B1 | 1 | 43% | 2.5 | 0.8 | 0.10 | 0 | −100 | 125 | — | A | A |
| Example 9 | ZEONOR | 20 | 100 | 100 | 55 | R1 | B2 | 1.5 | 41% | 2.1 | 1.5 | 0.25 | 0 | −180 | 120 | — | A | A |
| Example 10 | ZEONOR | 15 | 130 | 65 | 47 | R1 | B1 | 1 | 45% | 2.3 | 1.0 | 0.10 | 0 | −120 | 120 | — | A | A |
| Example 11 | ZEONOR | 15 | 150 | 75 | 53 | R1 | B1 | 1 | 43% | 2.3 | 0.8 | 0.25 | 0 | −100 | 125 | — | A | A |
| Example 12 | ARTON | 20 | 140 | 70 | 48 | R2 | B1 | 1 | 43% | 2.4 | 1.0 | 0.25 | 0 | −120 | 120 | — | A | A |
| Example 13 | ARTON | 20 | 140 | 85 | 52 | R1 | B1 | 1 | 43% | 2.1 | 1.0 | 0.25 | 0 | −120 | 120 | — | A | A |
| Example 14 | ARTON | 25 | 100 | 50 | 47 | R1 | B1 | 1 | 30% | 2.2 | 1.0 | 0.25 | 0 | −120 | 120 | — | A | A |
| Example 15 | ARTON | 25 | 100 | 90 | 59 | R1 | B1 | 1 | 22% | 1.1 | 1.0 | 0.05 | 0 | −120 | 120 | — | A | A |
| Example 16 | ZEONOR | 20 | 80 | 40 | 64 | D1 | B2 | 1.5 | 40% | 2.0 | 0.9 | 0.10 | 110 | −55 | — | 122 | A | B |
| Example 17 | ZEONOR | 20 | 85 | 45 | 50 | D2 | B2 | 1.5 | 40% | 2.3 | 0.9 | 0.10 | 110 | −55 | — | 122 | A | B |
| Example 18 | ARTON | 24 | 115 | 78 | 50 | R1 | B1 | 1 | 25% | 2.1 | 1.3 | 0.02 | 0 | −160 | 123 | — | A | A |
| Example 19 | ARTON | 24 | 116 | 78 | 49 | R1 | B1 | 1 | 41% | 2.2 | 1.3 | 0.25 | 0 | −160 | 123 | — | A | A |
| Example 20 | ARTON | 24 | 117 | 80 | 49 | R1 | B1 | 4.5 | 39% | 1.4 | 1.1 | 0.25 | 0 | −130 | 118 | — | A | A |
| Comparative Example 1 | ARTON | 25 | 0.4 | 5 | 49 | R1 | B1 | — | — | — | 0.8 | 0.20 | 0 | −100 | 125 | — | A | C |
| Comparative Example 2 | ARTON | 24 | 116 | 79 | 47 | R1 | B1 | 10 | 32% | 1.1 | 1.1 | 0.25 | 0 | −100 | 91 | — | C | A |
| Comparative Example 3 | ARTON | 25 | 116 | 79 | 73 | R1 | B1 | 1 | 10% | 1.0 | 0.8 | 0.10 | 0 | −100 | 125 | — | A | C |
| Comparative Example 4 | ZEONOR | 23 | 117 | 80 | 50 | R1 | — | — | — | — | 0.8 | — | 0 | −100 | 125 | — | A | C |
| Comparative Example 5 | ARTON | 24 | 116 | 79 | 47 | R1 | B1 | 1 | 8% | 1.0 | 1.2 | 0.40 | 0 | −100 | 83 | — | C | A |
| Comparative Example 6 | ARTON | 24 | 118 | 80 | 48 | R1 | — | — | — | — | 0.8 | 0.20 | 0 | −100 | 125 | — | A | C |
| Comparative Example 7 | ARTON | 20 | 140 | 70 | 50 | R2 | B1 | 10 | 28% | 1.1 | 1.1 | 0.25 | 0 | −100 | 91 | — | C | A |
| Comparative Example 8 | ZEONOR | 20 | 80 | 40 | 48 | D1 | B2 | 10 | 33% | 1.1 | 0.9 | 0.10 | 80 | −40 | — | 89 | C | A |
| Comparative Example 9 | ZEONOR | 20 | 85 | 45 | 52 | D2 | B2 | 10 | 30% | 1.1 | 0.9 | 0.10 | 84 | −42 | — | 93 | C | A |

Examples 2 to 17, Comparative Examples 1 to 4, and Comparative Examples 6 to 9

Optical films of Examples 2 to 17 and Comparative Examples 1 to 4 and 6 to 9 were prepared and evaluated in the same manner as in Example 1 except that the kind of the polymer film, the film thickness, Re(550), Rth(550), the kind of the liquid crystal compound, the kind and the added amount of the compound represented by Formula (I) above, and the thickness of the liquid crystal layer were changed to values shown in Table 1 above. The results are shown in Table 1 above.

In Table 1 above, in Examples 16 and 17, a discotic liquid crystal compound was used. Since the phase difference was different from the phase differences in other examples, the alignment was evaluated based on the value of Re(550) with respect to a film thickness of 1 μm of the liquid crystal layer instead of the value of |Rth(550)| with respect to a film thickness of 1 μm of the liquid crystal layer. The evaluation was performed based on the same standards as in a case of using the value of |Rth(550)| with respect to a film thickness of 1 μm of the liquid crystal layer.

In Table 1 above, regarding the kind of the polymer film, ARTON means ARTON FILM (trade name) manufactured by JSR Corporation and ZEONOR means ZEONOR FILM (trade name) manufactured by Zeon Corporation. In addition, a non-stretched polymer film was subjected to a stretching treatment so as to have a film thickness, Re(550), and Rth(550) shown in Table 1, and thus polymer films of each of Examples and Comparative Examples were prepared.

In addition, the structure of the changed compound is shown below.

Liquid crystal compound R2

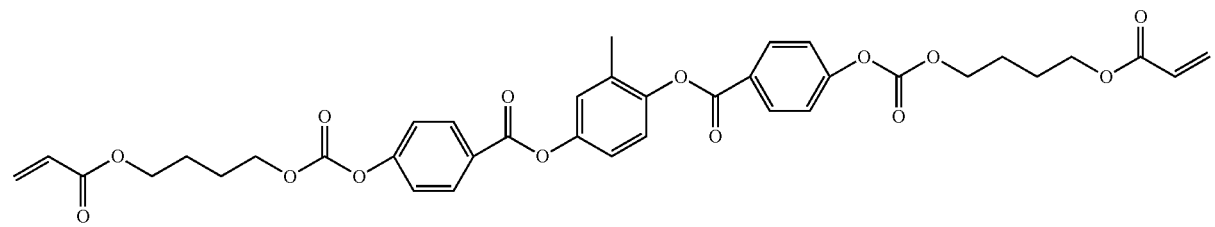 [SMILES: C=CC(=O)OCCCCOC(=O)Oc1ccc(C(=O)Oc2ccc(OC(=O)c3ccc(OC(=O)OCCCCOC(=O)C=C)cc3)c(C)c2)cc1]

Liquid crystal compound D1

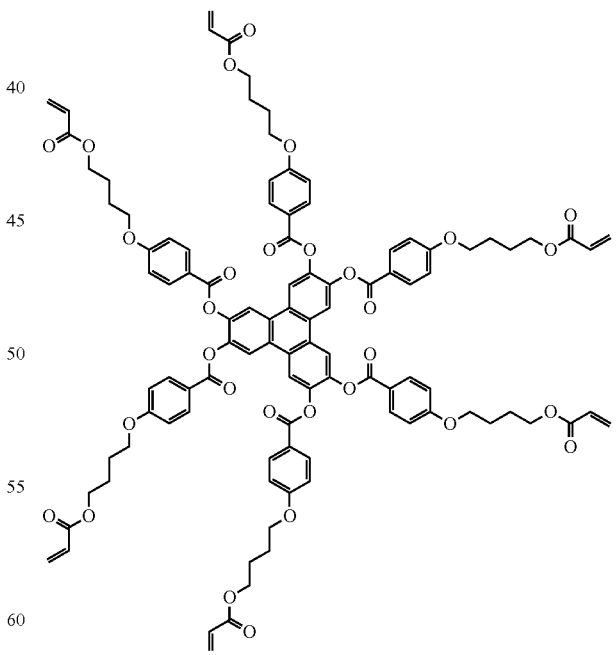

Liquid crystal compound D2
Mixture of discotic liquid crystal compounds (DA) and (DB) below at 80:20 (mass ratio)

(DA)
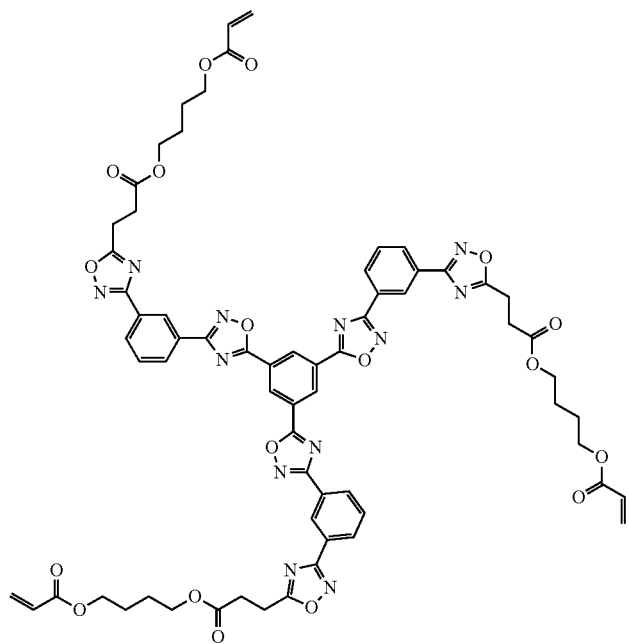
(DB)
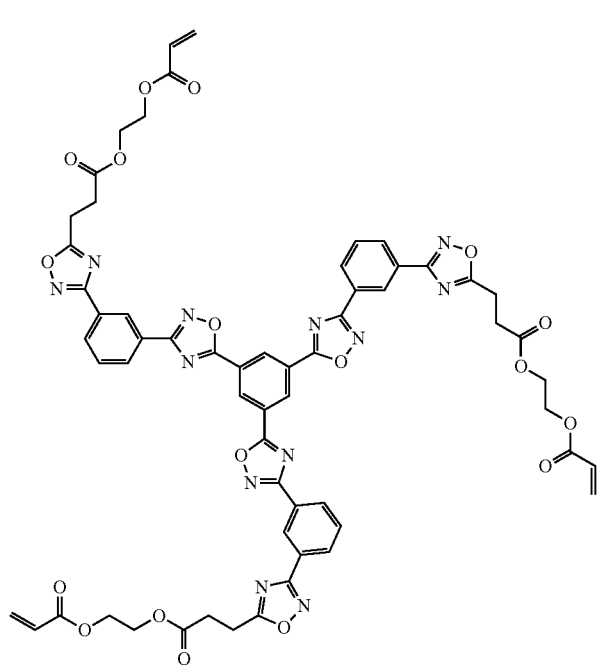
Compound B2 represented by Formula (I)
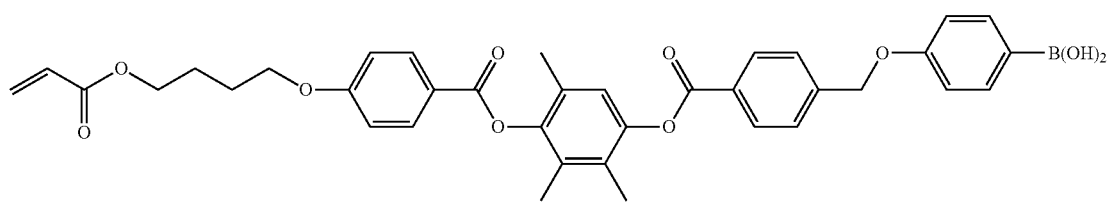 [SMILES: C=CC(=O)OCCCCOc1ccc(C(=O)Oc2c(C)cc(OC(=O)c3ccc(COc4ccc(B(O)O)cc4)cc3)c(C)c2C)cc1]

Compound B3 represented by Formula (I)

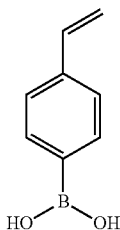

Example 18

An optical film of Example 18 was prepared in the same manner as in Example 1 except that in the liquid crystal composition, instead of using 250.0 parts by mass of methyl acetate, 250.0 parts by mass of acetone was used, and the thickness of the polymer film, Re(550), Rth(550), the kind of the liquid crystal compound, the kind and the added amount of the compound represented by Formula (I) above, and the thickness of the liquid crystal layer were changed to values shown in Table 1 above. The results are shown in Table 1 above.

Example 19

An optical film of Example 19 was prepared in the same manner as in Example 1 except that in the liquid crystal composition, instead of using 250.0 parts by mass of methyl acetate, 205.0 parts by mass of acetone, 37.5 parts by mass of propylene glycol monomethyl ether acetate, and 7.5 parts by mass of methanol were used, and the thickness of the polymer film, Re(550), Rth(550), the kind of the liquid crystal compound, the kind and the added amount of the compound represented by Formula (I) above, and the thickness of the liquid crystal layer were changed to values shown in Table 1 above. The results are shown in Table 1 above.

Example 20

An optical film of Example 20 was prepared in the same manner as in Example 1 except that the following liquid crystal layer forming composition 2 was used and the film thickness of the polymer film, Re(550), Rth(550), and the thickness of the liquid crystal layer were changed to values shown in Table 1 above. The results are shown in Table 1 above.

| Liquid Crystal Layer Forming Composition 2 | |
|---|---|
| Liquid crystal compound R1 | 100.0 parts by mass |
| Alignment assistant (A1) | 2.0 parts by mass |
| Compound B1 represented by Formula (I) above | 4.5 parts by mass |
| Monomer (K1) | 8.0 parts by mass |
| Polymerization initiator (P3) | 5.0 parts by mass |
| Surfactant (S1) | 0.3 parts by mass |
| Surfactant (S2) | 0.5 parts by mass |
| Acetone | 229.6 parts by mass |
| Propylene glycol monomethyl ether acetate | 42.0 parts by mass |
| Methanol | 8.4 parts by mass |

Monomer (K1): VISCOAT #360 (manufactured by Osaka Organic Chemical Industry Ltd.)
Polymerization initiator (P3): OXE-01 (manufactured by BASF SE)

Surfactant S2 (weight-average molecular weight: 11,200)

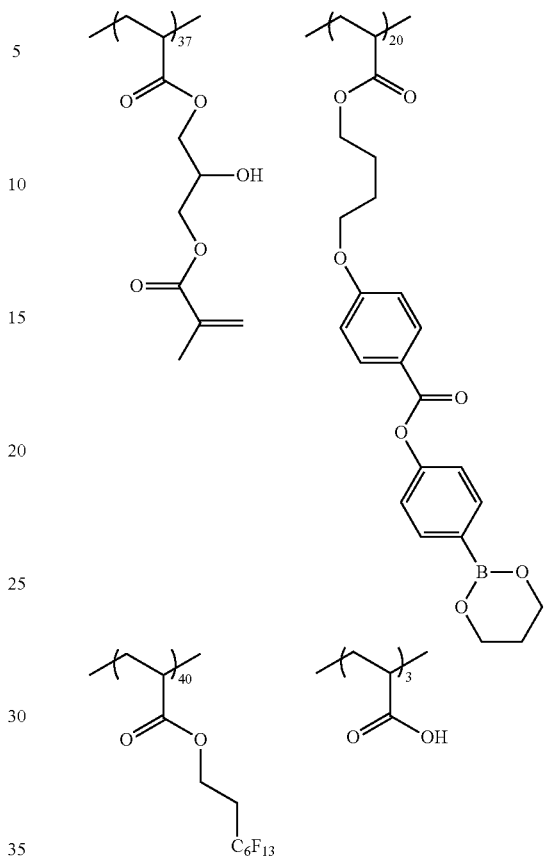

Comparative Example 5

An optical film of Comparative Example 5 was prepared in the same manner as in Example 1 except that in the liquid crystal composition, instead of using 250.0 parts by mass of methyl acetate, a mixture of 242.5 parts by mass of methyl acetate and 7.5 parts by mass of cyclohexanone was used, and the thickness of the polymer film, Re(550), Rth(550), the kind of the liquid crystal compound, the kind and the added amount of the compound represented by Formula (I) above, and the thickness of the liquid crystal layer were changed to values shown in Table 1 above. The results are shown in Table 1 above.

Examples 21 to 46 and Reference Example 1

<Preparation of Protective Film 1>
[Preparation of Core Layer Cellulose Acylate Dope 1]
The following composition was put into a mixing tank and stirred to dissolve each component. Thus, a core layer cellulose acylate dope 1 was prepared.

| Core Layer Cellulose Acylate Dope 1 | |
|---|---|
| Cellulose acetate having an acetyl substitution degree of 2.88 | 100 parts by mass |
| Ester oligomer A below | 10 parts by mass |
| Polarizer durability improving agent below | 4 parts by mass |
| Ultraviolet absorbent below | 2 parts by mass |

-continued

| Core Layer Cellulose Acylate Dope 1 | |
|---|---|
| Methylene chloride (first solvent) | 430 parts by mass |
| Methanol (second solvent) | 64 parts by mass |

Ester oligomer A (molecular weight MW: 750)

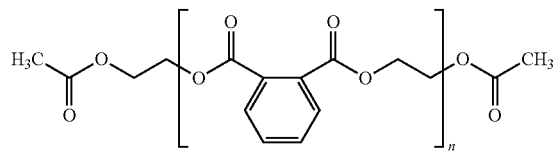

Polarizer durability improving agent

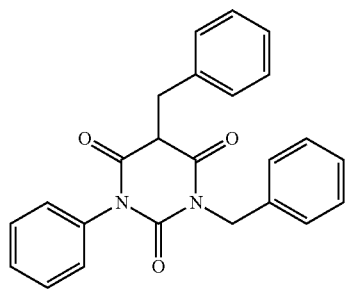 [SMILES: O=C1C(Cc2ccccc2)C(=O)N(c2ccccc2)C(=O)N1Cc1ccccc1]

Ultraviolet absorbent

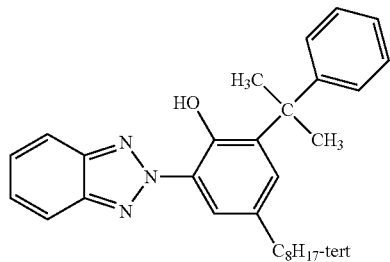

[Preparation of Outer Layer Cellulose Acylate Dope 1]

10 parts by mass of a matting agent solution below was added to 90 parts by mass of the core layer cellulose acylate dope 1 and thus an outer layer cellulose acylate dope 1 was prepared.

| Outer Layer Cellulose Acylate Dope 1 | |
|---|---|
| Silica particles having an average particle size of 20 nm (AEROSIL R972, manufactured by Nippon Aerosil Co., Ltd.) | 2 parts by mass |
| Methylene chloride (first solvent) | 76 parts by mass |
| Methanol (second solvent) | 11 parts by mass |
| Core layer cellulose acylate dope 1 | 1 part by mass |

[Preparation of Cellulose Acylate Film 1]

Three layers of the core layer cellulose acylate dope 1 and the outer layer cellulose acylate dope 1 on both sides thereof were cast on the drum at 20° C. from casting ports at the same time. In a state in which the solvent content reached about 20% by mass, the film was peeled off and the both ends of the film in the width direction were fixed with tenter clips. In a state in which the amount of the residual solvent reached 3% to 15% by mass, the film was dried while being stretched by 1.1 times in the cross direction. Then, the stretched film was conveyed between rolls in a heat treatment device and further dried. Thus, a cellulose acylate film 1 having a thickness of 40 μm was prepared and used as a protective film 1.

<Preparation of Protective Film 2>

[Preparation of Core Layer Cellulose Acylate Dope 2]

The following composition was put into a mixing tank and stirred to dissolve each component. Thus, a core layer cellulose acylate dope 2 was prepared.

| Core Layer Cellulose Acylate Dope 2 | |
|---|---|
| Cellulose acetate having an acetyl substitution degree of 2.88 | 100 parts by mass |
| Polyester below | 12 parts by mass |
| Polarizer durability improving agent above | 4 parts by mass |
| Methylene chloride (first solvent) | 430 parts by mass |
| Methanol (second solvent) | 64 parts by mass |

Polyester (number average molecular weight: 800)

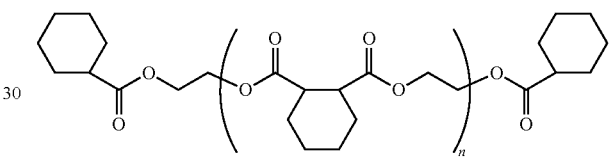

[Preparation of Outer Layer Cellulose Acylate Dope 2]

10 parts by mass of a matting agent solution below was added to 90 parts by mass of the core layer cellulose acylate dope 2 and thus an outer layer cellulose acylate dope 2 was prepared.

| Matting Agent Solution | |
|---|---|
| Silica particles having an average particle size of 20 nm (AEROSIL R972, manufactured by Nippon Aerosil Co., Ltd.) | 2 parts by mass |
| Methylene chloride (first solvent) | 76 parts by mass |
| Methanol (second solvent) | 11 parts by mass |
| Core layer cellulose acylate dope 2 | 1 part by mass |

[Preparation of Cellulose Acylate Film 2]

The core layer cellulose acylate dope 2 and the outer layer cellulose acylate dope 2 were filtered through a filter paper having an average pore diameter of 34 μm and a sintered metal filter having an average pore diameter of 10 μm and then three layers of the core layer cellulose acylate dope 2 and the outer layer cellulose acylate dope 2 on both sides thereof were cast on the drum at 20° C. from casting ports at the same time (band casting machine).

Next, in a state in which the solvent content reached about 20% by mass, the film was peeled off and the both ends of the film in the width direction were fixed with tenter clips and dried while being stretched at a stretching ratio of 1.1 times in the cross direction.

Then, the stretched film was conveyed between rolls in a heat treatment device and further dried. Thus, a cellulose acylate film 2 having a thickness of 40 μm was prepared and used as a protective film 2.

<Preparation of Cellulose Acylate Films 3 to 5>

In the preparation of the protective film 2, the dope jetting amount and the stretching ratio were adjusted to variously adjust the film thickness and optical properties variously. Cellulose acylate films 3 to 5 shown in Table 2 below were prepared and used as protective films 3 to 5 respectively.

<Preparation of Protective Film 6>

[Preparation of Core Layer Cellulose Acylate Dope 3]

The following composition was put into a mixing tank and stirred to dissolve each component. Thus, a core layer cellulose acylate dope 3 was prepared.

| Core Layer Cellulose Acylate Dope 3 | |
|---|---|
| Cellulose ester (acetyl substitution degree: 2.86) | 100 parts by mass |
| Ester compound 1 below | 5.9 parts by mass |
| Sugar ester compound 2 below | 2.0 parts by mass |
| Ultraviolet absorbent above | 2.4 parts by mass |
| Methylene chloride | 266 parts by mass |
| Methanol | 58 parts by mass |
| Butanol | 2.6 parts by mass |

Sugar ester compound 1

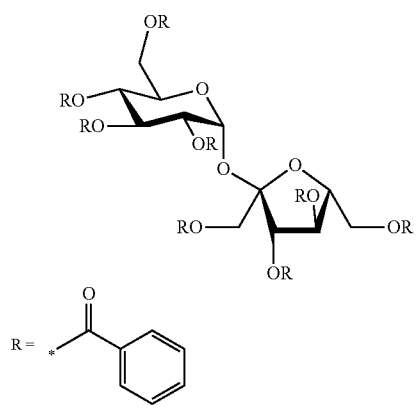

Sugar ester compound 2

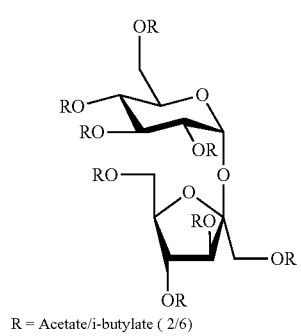

R = Acetate/i-butylate ( 2/6)

[Preparation of Outer Layer Cellulose Acylate Dope 3]

The following composition was put into a mixing tank and stirred to dissolve each component. Thus, an outer layer cellulose acylate dope 3 was prepared.

| Outer Layer Cellulose Acylate Dope 3 | |
|---|---|
| Cellulose ester (acetyl substitution degree: 2.86) | 100 parts by mass |
| Sugar ester compound 1 above | 5.9 parts by mass |
| Sugar ester compound 2 above | 2.0 parts by mass |
| Ultraviolet absorbent above | 2.4 parts by mass |
| Silica particle dispersion liquid (average particle size: 16 nm) (AEROSIL R972", manufactured by Nippon Aerosil Co., Ltd.) | 0.078 parts by mass |
| Methylene chloride | 339 parts by mass |
| Methanol | 74 parts by mass |
| Butanol | 3 parts by mass |

[Casting and Film Formation of Cellulose Acylate Film 6]

The core layer cellulose acylate dope 3 and the outer layer cellulose acylate dope 3 were filtered through a filter paper having an average pore diameter of 34 μm and a sintered metal filter having an average pore diameter of 10 μm and then three layers of the core layer cellulose acylate dope 3 and the outer layer cellulose acylate dope 3 on both sides thereof were cast on the drum cooled to −7° C. from casting ports at the same time (drum casting machine). The cast film was hit by dry air at 34° C. on the drum with at 270 m³/min and then the cellulose ester film was peeled off from the drum, and the both ends of the film were clipped with pin tenters. At the time of peeling, the film was stretched by 11.0% in the longitudinal direction (conveyance direction). Further, the film was dried while keeping the width such that the ratio in the width direction reached 5.0%. The film was wounded and a cellulose acylate film 6 was prepared and used as a protective film 6.

<Preparation of Protective Film 7>

[Preparation of Polymethyl Methacrylate (PMMA) Dope]

The following dope composition was put into a mixing tank and stirred to dissolve each component. Thus, a PMMA dope was prepared.

| PMMA Dope | |
|---|---|
| PMMA resin | 100 parts by mass |
| SUMILIZER GS (manufactured by Sumitomo Chemical Co., Ltd.) | 0.1 parts by mass |
| Dichloromethane | 426 parts by mass |
| Methanol | 64 parts by mass |

[Preparation of PMMA Film]

The above PMMA dope was uniformly cast from a casting die to a stainless steel band (casting support) (band casting machine). When the amount of the residual amount of the solvent in the cast film reached 20% by mass, the cast film was peeled off from the casting support as a cast film. In a state in which the solvent content reached 20% by mass, the film was peeled off and the both ends of the film in the width direction were fixed with tenter clips and dried while being stretched at a stretching ratio of 1.1 times in the cross direction. Then, the stretched film was conveyed between rolls in a heat treatment device and further dried. Thus, a PMMA film having a thickness of 40 μm was prepared and used as a protective film 7.

The film thickness of each of the obtained protective films, Re(550), Rth(550), and Rth(450) are shown in Table 2.

TABLE 2

| | Film thickness (μm) | Re (550) | Rth (550) | Rth (450) | ΔRth |
|---|---|---|---|---|---|
| Protective film 1 | 40 | 2 nm | 7 nm | 1 nm | 6 nm |
| Protective film 2 | 40 | 1 nm | −5 nm | −13 nm | 8 nm |
| Protective film 3 | 80 | 2 nm | −10 nm | −22 nm | 12 nm |
| Protective film 4 | 20 | 1 nm | 2 nm | −1 nm | 3 nm |
| Protective film 5 | 80 | 1 nm | −5 nm | −12 nm | 7 nm |
| Protective film 6 | 40 | 1 nm | 28 nm | 23 nm | 5 nm |
| Protective film 7 | 40 | 2 nm | −3 nm | −4 nm | 1 nm |

<Saponification Treatment of Protective Film>

Each of the prepared protective films 1 to 7 was immersed in 2.3 mol/L of an aqueous sodium hydroxide solution at 55° C. for 3 minutes. The film was washed in a washing bath at room temperature and neutralized with 0.05 mol/L of acid at 30° C. The film was washed in the washing bath at room temperature again and further dried with hot air at 100° C., and the surface of the protective film was subjected to a saponification treatment.

<Preparation of Optical Film>

Optical films of Examples 21 to 46 were prepared in the same manner as in Example 1 except that the kind of the polymer film, the film thickness, Re(550), Rth(550), and the film thickness of the liquid crystal layer were changed to values shown in Table 3 below.

<Corona Treatment of Optical Film>

The prepared optical film and the surface of the protective film to be laminated with the polarizer were subjected to a corona treatment in a discharge amount of 125 W·min/m².

<Preparation of Polarizing Plate>

The prepared protective films, polyvinyl alcohol-based polarizers, and optical films were laminated using an adhesive to have the configurations shown in Table 3 below.

As the adhesive, SK2057 manufactured by Soken Chemical & Engineering Co., Ltd. was used for lamination of the polymer film and the protective film and lamination of the protective film and the polarizer and a 3% aqueous solution of PVA (PVA-117H manufactured by Kuraray Co., Ltd.) was used for lamination of the polymer film and the protective film of other examples.

<Preparation of Liquid Crystal Display Device>

A polarizing plate was peeled off from a liquid crystal cell of an iPad (registered trademark, manufactured by Apple Inc.) and was used as an IPS mode liquid crystal cell.

Instead of the peeled-off polarizing plate, each of the prepared polarizing plate was laminated with the liquid crystal cell using SK2057 manufactured by Soken Chemical & Engineering Co., Ltd. to have the configurations shown in Table 3 below and liquid crystal display devices of Examples 21 to 46 and Reference Example 1 were respectively prepared.

In Table 3 below, the configuration column represents that the layer configurations of the liquid crystal display device and the axial relationships adopt configurations in FIGS. 2 to 5. Here, the arrow on each layer indicates an absorption axis direction in the polarizer and a slow axis direction in other layers. In addition, the column of the protective film represents that which of the prepared protective films 1 to 7 is used as protective films a to d in the configurations in FIGS. 2 to 5. "Not provided" represents that the protective film is not arranged at the position.

In addition, Reference Example 1 has a configuration in which the optical film of the present invention is not arranged.

The display performance of the laminated iPad (registered trademark) was confirmed and it was confirmed that unevenness could not be visually observed at all. In addition, it was confirmed that light leakage in an oblique direction was good in black display and there was almost no color shift. In addition, the viewing angle contrast (viewing angle CR) and the tint were measured by the following method. The evaluation results are shown in Table 3 below.

Production Examples 1 to 3

Polarizing plates and liquid crystal display devices were configured in the same manner as in other examples except that one surface of a cycloolefin polymer film (trade name: ARTON FILM, Re=275 nm, Rth=0 nm, film thickness 130 μm, manufactured by JSR Corporation) was subjected to a corona treatment in a discharge amount of 125 W·min/m² and the surface was used as a lamination surface instead of using the optical film of the present invention, and the viewing angle contrast (viewing angle CR) and the tint were measured by the following method. The evaluation results are shown in Table 3.

<<Measurement of Viewing Angle Contrast and Tint>>

Regarding the liquid crystal display device of each of Examples and Comparative Examples, using a measurement machine "EZ-Contrast XL88" (manufactured by ELDIM), luminance (Yw) in white display and luminance (Yb) in black display were measured at an interval of 1° from an azimuthal angle of 0° (horizontal direction) to 359° in a counterclockwise direction, and at an interval of 1° from a polar angle of 0° (front direction) to 88°, the contrast ratio (Yw/Yb) was calculated, and thus the contrast ratio in an azimuthal angle 45° direction and in a polar angle 60° direction was evaluated based on the following evaluation standards.

A: A high contrast ratio region was particularly wide and the contrast ratio was particularly excellent (a contrast ratio of 200 or more).

B: A high contrast ratio region was wide and the contrast ratio was excellent (a contrast ratio of 100 to less than 200)

C: A high contrast ratio region was narrow (a contrast ratio of less than 100)

<<Evaluation of Tint>>

Based on Reference Example 1, a change in tint at all azimuthal angles and polar angles during black display was visually evaluated.

++++: No change in tint was observed at almost all azimuthal angles and polar angles.

+++: Only in a case where the polar angle was particularly large (60° or more), a slight change in tint was observed at a specific azimuthal angle along with the rotation of the panel, and no change in tint was observed in other cases.

++: Only in a case where the polar angle was particularly large (60° or more), a change in tint was observed along with the rotation of the panel but as the polar angle became smaller, the change in tint became smaller.

+: A change in tint was observed in the entire region other than the panel front surface but the change in tint at a specific azimuthal angle was small.

=: A change in tint was similar to Reference Example (a change in tint was observed in regions other than the panel front surface).

TABLE 3

Figure 2:
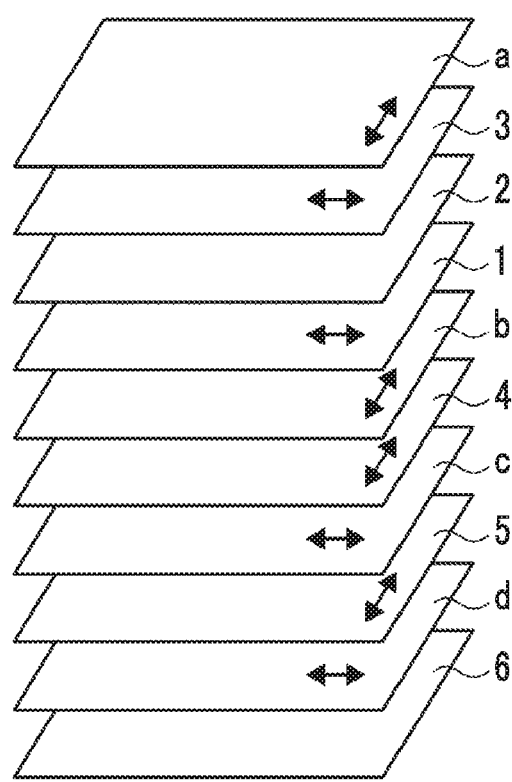
FIG. 2 is a schematic view showing an example of a layer configuration of a liquid crystal display device in Examples.
Figure 3:
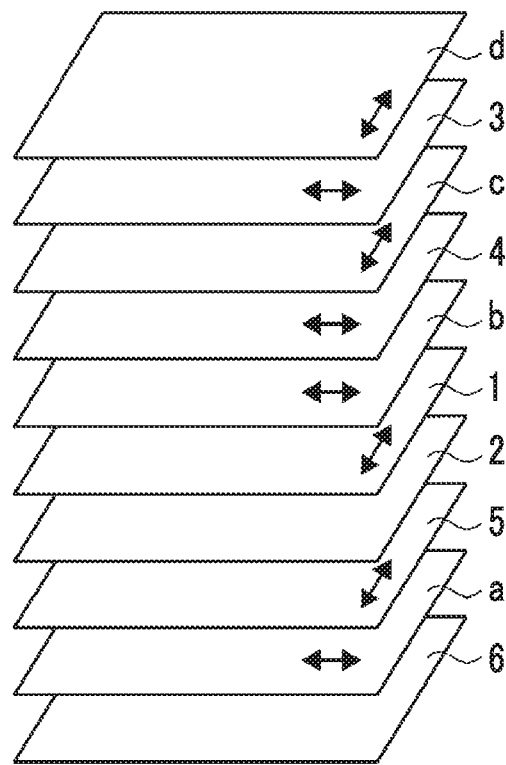
FIG. 3 is a schematic view showing another example of the layer configuration of the liquid crystal display device in Examples.
Figure 4:
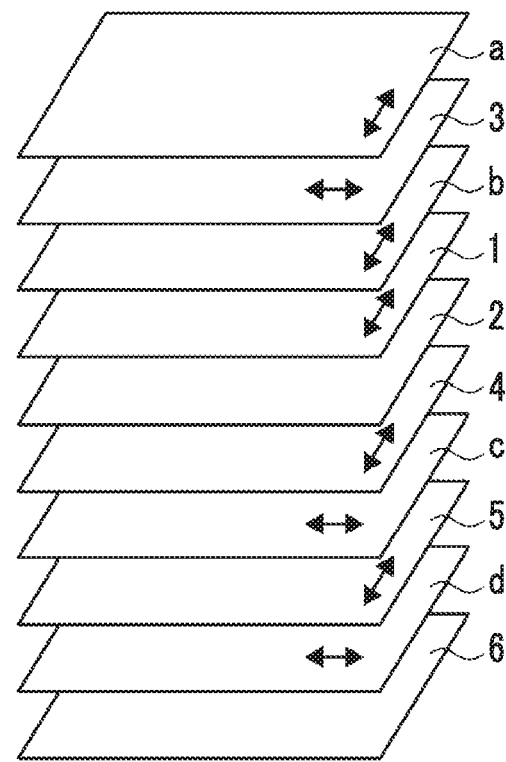
FIG. 4 is a schematic view showing still another example of the layer configuration of the liquid crystal display device in Examples.
Figure 5:
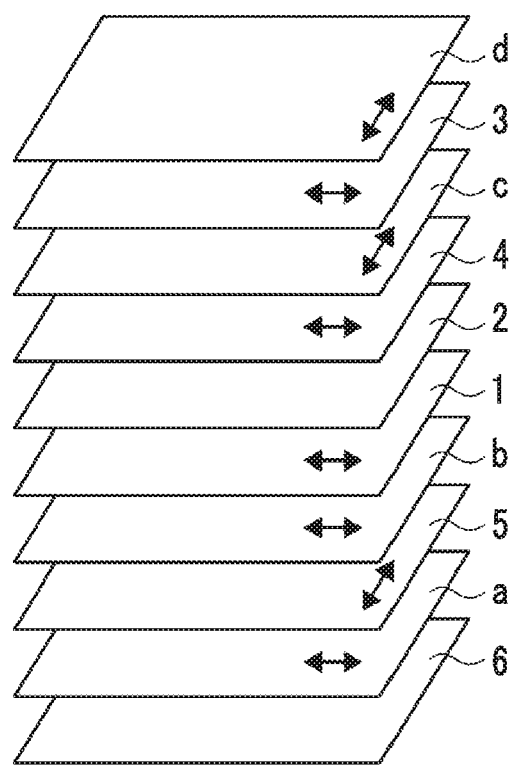
FIG. 5 is a schematic view showing still another example of the layer configuration of the liquid crystal display device in Examples.

| | | Polymer film | | | Liquid crystal layer | | | Con-figu-ration | Protective film | | | | Evaluation | | |
|---|---|---|---|---|---|---|---|---|---|---|---|---|---|---|---|
| | Kind | Film thickness [μm] | Re(550) [nm] | Rth(550) [nm] | Film thickness [μm] | Re(550) [nm] | Rth(550) [nm] | | a | b | c | d | Viewing angle CR | Yw/Yb | Tint |
| Example 21 | ARTON | 21 | 90 | 45 | 0.8 | 0 | −100 | FIG. 2 | 1 | Not provided | 2 | 1 | B | 180 | + |
| Example 22 | ARTON | 26 | 120 | 60 | 0.6 | 0 | −70 | FIG. 2 | 1 | Not provided | 2 | 1 | B | 180 | + |
| Example 23 | ARTON | 25 | 120 | 60 | 0.8 | 0 | −100 | FIG. 2 | 1 | Not provided | 2 | 1 | A | 250 | +++ |
| Example 24 | ARTON | 25 | 120 | 60 | 1.1 | 0 | −130 | FIG. 2 | 1 | Not provided | 2 | 1 | B | 180 | + |
| Example 25 | ARTON | 24 | 150 | 75 | 0.8 | 0 | −100 | FIG. 2 | 1 | Not provided | 2 | 1 | B | 180 | + |
| Example 26 | ARTON | 25 | 120 | 60 | 0.8 | 0 | −100 | FIG. 2 | 1 | 2 | 2 | 1 | A | 300 | ++++ |
| Example 27 | ZEONOR | 20 | 120 | 60 | 0.8 | 0 | −100 | FIG. 2 | 1 | Not provided | 2 | 1 | A | 250 | +++ |
| Example 28 | ARTON | 26 | 150 | 75 | 1.0 | 0 | −120 | FIG. 3 | 1 | Not provided | 2 | 1 | B | 110 | = |
| Example 29 | ARTON | 26 | 150 | 75 | 1.0 | 0 | −120 | FIG. 3 | 1 | 2 | 2 | 1 | B | 150 | + |
| Example 30 | ARTON | 23 | 130 | 90 | 1.3 | 0 | −150 | FIG. 4 | 1 | Not provided | 2 | 1 | B | 140 | = |
| Example 31 | ARTON | 23 | 130 | 90 | 1.3 | 0 | −150 | FIG. 4 | 1 | 2 | 2 | 1 | B | 190 | ++ |
| Example 32 | ARTON | 22 | 100 | 65 | 0.8 | 0 | −90 | FIG. 5 | 1 | Not provided | 2 | 1 | B | 150 | = |
| Example 33 | ARTON | 20 | 130 | 90 | 0.5 | 0 | −60 | FIG. 5 | 1 | Not provided | 2 | 1 | B | 150 | = |
| Example 34 | ARTON | 24 | 130 | 90 | 0.8 | 0 | −90 | FIG. 5 | 1 | Not provided | 2 | 1 | A | 200 | = |
| Example 35 | ARTON | 24 | 130 | 90 | 1.0 | 0 | −120 | FIG. 5 | 1 | Not provided | 2 | 1 | B | 150 | = |
| Example 36 | ARTON | 27 | 160 | 105 | 0.8 | 0 | −90 | FIG. 5 | 1 | Not provided | 2 | 1 | B | 150 | = |
| Example 37 | ARTON | 24 | 130 | 90 | 0.8 | 0 | −90 | FIG. 5 | 1 | 2 | 2 | 1 | A | 280 | +++ |
| Example 38 | ARTON | 24 | 130 | 90 | 0.8 | 0 | −90 | FIG. 5 | 1 | 3 | 2 | 1 | A | 300 | ++++ |
| Example 39 | ARTON | 24 | 130 | 90 | 0.8 | 0 | −90 | FIG. 5 | 1 | 1 | 2 | 1 | A | 250 | ++ |
| Example 40 | ARTON | 15 | 130 | 95 | 0.8 | 0 | −90 | FIG. 5 | 1 | 2 | 2 | 1 | A | 280 | = |
| Example 41 | ARTON | 24 | 130 | 90 | 0.8 | 0 | −90 | FIG. 5 | 1 | 6 | 2 | 1 | A | 230 | + |
| Example 42 | ARTON | 24 | 130 | 90 | 0.8 | 0 | −90 | FIG. 5 | 1 | 4 | 2 | 1 | A | 220 | + |
| Example 43 | ARTON | 24 | 130 | 90 | 0.8 | 0 | −90 | FIG. 5 | 1 | 5 | 2 | 1 | A | 270 | +++ |
| Example 44 | ARTON | 24 | 130 | 90 | 0.8 | 0 | −90 | FIG. 5 | 1 | 7 | 2 | 1 | A | 200 | = |
| Example 45 | ARTON | 24 | 130 | 90 | 0.8 | 0 | −90 | FIG. 5 | 1 | 2 | Not provided | 1 | A | 280 | ++ |
| Example 46 | ARTON | 24 | 130 | 90 | 0.8 | 0 | −90 | FIG. 5 | 1 | 3 | Not provided | 1 | A | 300 | +++ |
| Production Example 1 | ARTON | 130 | 275 | 0 | — | — | — | FIG. 5 | 1 | 2 | 2 | 1 | A | 300 | ++++ |
| Production Example 2 | ARTON | 130 | 275 | 0 | — | — | — | FIG. 5 | 1 | 5 | 2 | 1 | A | 280 | +++ |
| Production Example 3 | ARTON | 130 | 275 | 0 | — | — | — | FIG. 5 | 1 | Not provided | 2 | 1 | A | 250 | + |
| Reference Example 1 | | Not provided | | | Not provided | | | FIG. 2 | 1 | 2 | 2 | 1 | C | 20 | = |

[Evaluation of Polarizing Plate Adhesiveness]

(Preparation of Adhesive)

The following compounds were mixed at the following ratio and an adhesive solution A was prepared.

ARONIX M-220 (manufactured by Toagosei Co., Ltd.): 20 parts by mass 4-hydroxybutyl acrylate (manufactured by Nippon Kasei Chemical Co., Ltd.): 40 parts by mass 2-Ethylhexyl acrylate (manufactured by Mitsubishi Chemical Corporation): 40 parts by mass Irgacure 907 (manufactured by BASF SE): 1.5 parts by mass KAYACURE DETX-S (manufactured by Nippon Kayaku Co., Ltd.): 0.5 parts by mass Example 47

A polarizing plate and a liquid crystal display device were prepared in the same manner as in Example 34 except that the lamination method of the polarizer and the optical film of the present invention at the time of preparing the polarizing plate was changed as described below.

In a case of preparing the polarizing plate, the adhesive solution A was applied to the liquid crystal layer side of the optical film so as to have a thickness of 0.5 μm. Thereafter, the adhesive applied surface was laminated with the polarizer and irradiated with ultraviolet rays in 1000 mJ/cm² from the base material side of the optical film in an air atmosphere at 40° C. Then, drying was performed at 60° C. for 3 minutes and a polarizing plate of Example 47 was prepared.

Example 48

A polarizing plate and a liquid crystal display device were prepared in the same manner as in Example 47 except that the curing condition of the liquid crystal layer at the time of preparing the optical film was changed such that the irradiation amount of ultraviolet rays was 10 mJ/cm² at 40° C. in an oxygen concentration of 0.1% under nitrogen purge.

Example 49

A polarizing plate and a liquid crystal display device were prepared in the same manner as in Example 48 except that the surface of the liquid crystal layer of the optical film was subjected to a corona treatment in a discharge amount of 125 W·min/m², was then coated with the adhesive solution A, and was laminated with the polarizer.

Example 50

A polarizing plate and a liquid crystal display device were prepared in the same manner as in Example 49 by subjecting the surface of the liquid crystal layer to a corona treatment and applying the adhesive solution A to the surface of the liquid crystal layer except that the curing condition of the liquid crystal layer at the time of preparing the optical film was changed such that the irradiation amount of ultraviolet rays was 300 mJ/cm² at 40° C. in an air atmosphere.

Example 51

A polarizing plate and a liquid crystal display device of Example 51 were prepared in the same manner as in Example 50 except that a liquid crystal layer forming composition 3 was used at the time of forming a liquid crystal layer.

| Liquid Crystal Layer Forming Composition 3 | |
|---|---|
| Liquid crystal compound R1 | 100.0 parts by mass |
| Alignment assistant (A1) | 2.0 parts by mass |
| Compound B1 represented by Formula (I) | 4.5 parts by mass |
| Monomer (K2) below | 8.0 parts by mass |
| Polymerization initiator (P3) | 2.0 parts by mass |
| Polymerization initiator (P4) below | 5.0 parts by mass |
| Surfactant (S1) | 0.3 parts by mass |
| Surfactant (S2) | 0.5 parts by mass |
| Acetone | 229.6 parts by mass |
| Propylene glycol monomethyl ether acetate | 42.0 parts by mass |
| Methanol | 8.4 parts by mass |

Monomer (K2): KARENZ MT BD1 (manufactured by Showa Denko K.K.)

Polymerization initiator (P4): IRGACURE 127 (manufactured by BASF SE)

The viewing angle CR, Yw/Yb, and tint of the prepared polarizing plates of Examples 47 to 51 had the same values as in Example 34. In addition, the adhesiveness of the polarizing plates of Examples 47 to 51 was evaluated by the following method. As a result, it was confirmed that while the polarizing plate of Example 47 was determined as D, the polarizing plate of Example 48 was determined as C, the polarizing plate of Example 49 was determined as B, and the polarizing plates of Examples 50 and 51 were determined as A, which were improved. In addition, in the polarizing plates of Examples 49 to 51 in which the surface of the liquid crystal layer was subjected to a corona treatment before lamination, a good surface state was obtained without cissing of the adhesive or the like.

<Adhesiveness Evaluation of Optical Film and Polarizer>

The adhesiveness evaluation was performed by the cross-cut method according to JIS K 5600-5-6-1.

Specifically, hundred crosscuts were made on the surface of the optical film of the prepared polarizing plate at 1-mm intervals and an adhesion test was performed with a cellophane tape (manufactured by Nichiban Co., Ltd.).

After a new cellophane tape was attached and then peeled off, the adhesiveness was determined based on the following standards.

A: No peeling-off occurred in the grids of the crosscuts.
B: The percentage of grids having no peeling-off among the crosscuts was 50% or more and less than 100%.
C: The percentage of grids having no peeling-off among the crosscuts was 20% or more and less than 50%.
D: The percentage of grids having no peeling-off among the crosscuts was less than 20%.

The standards A, B, and C do not cause practical problems. The standard A is preferable.

EXPLANATION OF REFERENCES

10: optical film
1: polymer film
2: liquid crystal layer
3, 5: polarizer
4: liquid crystal cell
6: backlight
a: protective film a
b: protective film b
c: protective film c
d: protective film d

What is claimed is:

1. An optical film comprising:
a polymer film including a cycloolefin-based polymer; and
a liquid crystal layer that is provided adjacent to the polymer film,
wherein the liquid crystal layer is formed by using a liquid crystal composition containing a liquid crystal compound and a compound represented by Formula (I),
the liquid crystal composition contains the compound represented by Formula (I) at a content of 0.5% to 7.0% by mass with respect to a mass of the liquid crystal compound, and
an eccentricity value represented by Expression (1-1) is 20% to 80%, $$(Z)_n\text{-}L^{100}\text{-}(Q)_m \qquad \text{Formula (I)}$$

in Formula (I),
Z represents a substituent having a polymerizable group, n represents an integer of 0 to 4, and in a case where n is an integer of 2 to 4, two or more Z's may be the same as or different from each other;
Q represents a substituent containing at least one boron atom, m represents 1 or 2, and in a case where m is 2, two Q's may be the same as or different from each other; and
$L^{100}$ represents an (n+m)-valent linking group; where in a case where n represents 0 and m represents 1, $L^{100}$ represents a hydrogen atom, a substituted or unsubstituted alkyl group, a substituted or unsubstituted alkenyl group, a substituted or unsubstituted alkynyl group, a substituted or unsubstituted aryl group, or a substituted or unsubstituted heteroaryl group, $$S_{0.1}/S_{total} \times 100\% \qquad \text{Expression (1-1)}$$

in Expression (1-1), $S_{total}$ represents an integrated value of $BO_2^-$ secondary ion intensity detected by time-of-flight secondary ion mass spectrometry; and $S_{0.1}$ represents an integrated value of $BO_2^-$ secondary ion intensity detected by time-of-flight secondary ion mass spectrometry in a region from the interface of the liquid crystal layer with the polymer film to a distance of 1/10 of the film thickness of the liquid crystal layer.

2. An optical film comprising:

a polymer film including a cycloolefin-based polymer; and a liquid crystal layer that is provided adjacent to the polymer film, wherein the liquid crystal layer is formed by using a liquid crystal composition containing a liquid crystal compound and a compound represented by Formula (I), the liquid crystal composition contains the compound represented by Formula (I) at a content of 0.5% to 7.0% by mass with respect to a mass of the liquid crystal compound, and a peak intensity ratio represented by Expression (1-2) is 1.1 to 5.0, $$(Z)_n\text{-}L^{100}\text{-}(Q)_m \qquad \text{Formula (I)}$$

in Formula (I),

Z represents a substituent having a polymerizable group, n represents an integer of 0 to 4, and in a case where n is an integer of 2 to 4, two or more Z's may be the same as or different from each other;

Q represents a substituent containing at least one boron atom, m represents 1 or 2, and in a case where m is 2, two Q's may be the same as or different from each other, and $L^{100}$ represents an (n+m)-valent linking group; where in a case where n represents 0 and m represents 1, $L^{100}$ represents a hydrogen atom, a substituted or unsubstituted alkyl group, a substituted or unsubstituted alkenyl group, a substituted or unsubstituted alkynyl group, a substituted or unsubstituted aryl group, or a substituted or unsubstituted heteroaryl group, $$P_1/P_{ave} \qquad \text{Expression (1-2)}$$

in Expression (1-2), $P_1$ represents a peak intensity present on the side closest to the polymer film among peaks of $BO_2^-$ secondary ion intensity detected by time-of-flight secondary ion mass spectrometry; and $P_{ave}$ represents an average value of $BO_2^-$ secondary ion intensity detected by time-of-flight secondary ion mass spectrometry on a side more apart from the polymer film than from a peak position where the peak intensity of $P_1$ is calculated; where a secondary ion intensity of a peak closest to a surface of the liquid crystal layer opposite to the surface on which the polymer film is provided is excluded from calculation of $P_{ave}$.

3. The optical film according to claim 1, wherein the liquid crystal compound is vertically aligned.

4. The optical film according to claim 1, wherein the liquid crystal compound is a rod-like liquid crystal compound.

5. The optical film according to claim 1, wherein an in-plane retardation Re1(550) and a thickness direction retardation Rth1(550) of the polymer film at a wavelength of 550 nm respectively satisfy Expression (2) and Expression (3), and an in-plane retardation Re2(550) and a thickness direction retardation Rth2(550) of the liquid crystal layer at a wavelength of 550 nm respectively satisfy Expression (4) and Expression (5), or Expression (6) and Expression (7).

$5 \text{ nm} \leq Re1(550) \leq 300 \text{ nm}$ \hfill Expression (2)

$10 \text{ nm} \leq Rth1(550) \leq 240 \text{ nm}$ \hfill Expression (3)

$0 \text{ nm} \leq Re2(550) \leq 10 \text{ nm}$ \hfill Expression (4)

$-360 \text{ nm} \leq Rth2(550) \leq -50 \text{ nm}$ \hfill Expression (5)

$10 \text{ nm} \leq Re2(550) \leq 220 \text{ nm}$ \hfill Expression (6)

$-110 \text{ nm} \leq Rth2(550) \leq -5 \text{ nm}$ \hfill Expression (7)

6. A polarizing plate comprising:
the optical film according to claim 1; and
a polarizer.

7. The polarizing plate according to claim 6, further comprising:
a protective film.

8. The polarizing plate according to claim 7, wherein the protective film and the optical film are laminated through a pressure sensitive adhesive or an adhesive.

9. The polarizing plate according to claim 8, wherein an in-plane retardation Re3(550) and a thickness direction retardation Rth3(550) of the protective film at a wavelength of 550 nm respectively satisfy Expression (8) and Expression (9).

$0 \text{ nm} \leq Re3(550) \leq 10 \text{ nm}$ \hfill Expression (8)

$-40 \text{ nm} \leq Rth3(550) \leq 40 \text{ nm}$ \hfill Expression (9)

10. The polarizing plate according to claim 9, wherein the protective film is a wavelength dispersion compensation layer further satisfying Expression (10) and Expression (11).

$3 \text{ nm} \leq |Rth3(450) - Rth3(550)| \leq 30 \text{ nm}$ \hfill Expression (10)

$0 \text{ nm} \leq |Rth3(450)| < 30 \text{ nm}$ or $0 \text{ nm} \leq |Rth3(550)| < 30 \text{ nm}$ \hfill Expression (11)

11. The polarizing plate according to claim 7, wherein the protective film is a cellulose acylate film.

12. An image display device comprising:
the polarizing plate according to claim 6; and
an image display element.

13. An image display device comprising:
the polarizing plate according to claim 6;
an image display element; and
a facing polarizing plate,
wherein the image display element is a liquid crystal cell, and
the facing polarizing plate is a facing polarizing plate having a polarizer and a protective film satisfying Expression (10) and Expression (11) and is arranged such that the protective film is disposed on a liquid crystal cell side.

$3 \text{ nm} \leq |Rth3(450) - Rth3(550)| \leq 30 \text{ nm}$ \hfill Expression (10)

$0 \text{ nm} \leq |Rth3(450)| < 30 \text{ nm}$ or $0 \text{ nm} \leq |Rth3(550)| < 30 \text{ nm}$ \hfill Expression (11)

14. A polarizing plate comprising:
the optical film according to claim 2; and
a polarizer.

15. The polarizing plate according to claim 14, further comprising:
a protective film.

16. The polarizing plate according to claim 15,
wherein the protective film and the optical film are laminated through a pressure sensitive adhesive or an adhesive.

17. The polarizing plate according to claim 16,
wherein an in-plane retardation Re3(550) and a thickness direction retardation Rth3(550) of the protective film at a wavelength of 550 nm respectively satisfy Expression (8) and Expression (9).

$$0 \text{ nm} \leq Re3(550) \leq 10 \text{ nm} \quad \text{Expression (8)}$$

$$-40 \text{ nm} \leq Rth3(550) \leq 40 \text{ nm} \quad \text{Expression (9)}$$

18. The polarizing plate according to claim 17,
wherein the protective film is a wavelength dispersion compensation layer further satisfying Expression (10) and Expression (11).

$$3 \text{ nm} \leq |Rth3(450) - Rth3(550)| \leq 30 \text{ nm} \quad \text{Expression (10)}$$

$$0 \text{ nm} \leq |Rth3(450)| < 30 \text{ nm or } 0 \text{ nm} \leq |Rth3(550)| < 30 \text{ nm} \quad \text{Expression (11)}$$

19. The polarizing plate according to claim 15,
wherein the protective film is a cellulose acylate film.

20. An image display device comprising:
the polarizing plate according to claim 14; and
an image display element.

21. An image display device comprising:
the polarizing plate according to claim 14;
an image display element; and
a facing polarizing plate,
wherein the image display element is a liquid crystal cell, and
the facing polarizing plate is a facing polarizing plate having a polarizer and a protective film satisfying Expression (10) and Expression (11) and is arranged such that the protective film is disposed on a liquid crystal cell side.

$$3 \text{ nm} \leq |Rth3(450) - Rth3(550)| \leq 30 \text{ nm} \quad \text{Expression (10)}$$

$$0 \text{ nm} \leq |Rth3(450)| < 30 \text{ nm or } 0 \text{ nm} \leq |Rth3(550)| < 30 \text{ nm} \quad \text{Expression (11)}$$

* * * * *